US012802928B2

(12) United States Patent
Fritz et al.

(10) Patent No.: US 12,802,928 B2
(45) Date of Patent: Nov. 17, 2026

(54) METHOD FOR OPERATING A MULTIPLE PARTICLE BEAM SYSTEM WHILE ALTERING THE NUMERICAL APERTURE, ASSOCIATED COMPUTER PROGRAM PRODUCT AND MULTIPLE PARTICLE BEAM SYSTEM

(71) Applicant: Carl Zeiss MultiSEM GmbH, Oberkochen (DE)

(72) Inventors: Hans Fritz, Grabs (CH); Ingo Mueller, Aalen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 323 days.

(21) Appl. No.: 18/753,972

(22) Filed: Jun. 25, 2024

(65) Prior Publication Data

US 2024/0347316 A1 Oct. 17, 2024

Related U.S. Application Data

(63) Continuation of application No. 17/572,767, filed on Jan. 11, 2022, now Pat. No. 12,057,290, which is a (Continued)

(30) Foreign Application Priority Data

Jul. 31, 2019 (DE) ..................... 10 2019 005 362.1

(51) Int. Cl.

*H01J 37/10* (2006.01)
*H01J 37/145* (2006.01)
(Continued)

(52) U.S. Cl.

CPC .......... *H01J 37/3177* (2013.01); *H01J 37/10* (2013.01); *H01J 37/145* (2013.01); *H01J 37/147* (2013.01);
(Continued)

(58) Field of Classification Search

CPC .. H01J 37/10; H01J 37/12; H01J 37/14; H01J 37/141; H01J 37/1413; H01J 37/143;
(Continued)

(56) References Cited

U.S. PATENT DOCUMENTS 3,852,633 A 12/1974 Hunter
4,130,761 A 12/1978 Matsuda
(Continued)

FOREIGN PATENT DOCUMENTS

CN 105765691 A 7/2016
CN 109216143 A 1/2019
(Continued)

OTHER PUBLICATIONS

Office Action in Chinese Appln. No. 202080054443.2, mailed on Sep. 17, 2025, 7 pages (with English translation).
(Continued)

*Primary Examiner* — Sean Luck
(74) *Attorney, Agent, or Firm* — Fish & Richardson P.C.

(57) ABSTRACT

A method includes operating a multiple particle beam system at different working points. The numerical aperture can be set for each of the working points in such a way that the resolution of the multiple particle beam system is optimal. In the process, the beam pitch between adjacent individual particle beams on the sample to be scanned is kept constant as a boundary condition. There are no mechanical reconfigurations of the system whatsoever for the purposes of varying the numerical aperture.

10 Claims, 10 Drawing Sheets

Related U.S. Application Data continuation of application No. PCT/DE2020/000174, filed on Jul. 29, 2020.

(51) Int. Cl.
*H01J 37/147* (2006.01)
*H01J 37/26* (2006.01)
*H01J 37/302* (2006.01)
*H01J 37/317* (2006.01)

(52) U.S. Cl.
CPC ........ *H01J 37/263* (2013.01); *H01J 37/3023* (2013.01); *H01J 2237/0453* (2013.01); *H01J 2237/04926* (2013.01)

(58) Field of Classification Search
CPC .... H01J 37/145; H01J 37/147; H01J 37/3023; H01J 37/3177; H01J 2237/0435; H01J 2237/0437; H01J 2237/045; H01J 2237/0451; H01J 2237/0453; H01J 2237/0458; H01J 2237/0492; H01J 2237/04922; H01J 2237/04924; H01J 2237/04926; H01J 2237/04928
See application file for complete search history.

(56) References Cited

U.S. PATENT DOCUMENTS 4,153,843 A 5/1979 Pease
4,200,794 A 4/1980 Newberry
4,338,548 A 7/1982 Bono
4,742,234 A 5/1988 Feldman
5,215,623 A 6/1993 Takahashi
5,262,341 A 11/1993 Fueki et al.
5,534,311 A 7/1996 Shaw et al.
5,864,142 A 1/1999 Muraki
5,892,224 A 4/1999 Nakasuji
5,905,267 A 5/1999 Muraki
5,924,277 A 7/1999 Beattie et al.
5,981,954 A 11/1999 Muraki
6,107,636 A 8/2000 Muraki
6,124,599 A 9/2000 Muraki
6,137,113 A 10/2000 Muraki
6,323,499 B1 11/2001 Muraki
6,333,508 B1 12/2001 Katsap
6,617,595 B1 9/2003 Okunuki
6,633,366 B2 10/2003 De Jager
6,696,371 B2 2/2004 Butschke
6,768,118 B2 7/2004 Nakayama et al.
6,768,125 B2 7/2004 Platzgummer
6,787,780 B2 9/2004 Hamaguchi
6,804,288 B2 10/2004 Haraguchi
6,818,911 B2 11/2004 Tamamori
6,822,241 B2 11/2004 Schut et al.
6,835,508 B2 12/2004 Butschke
6,872,950 B2 3/2005 Shimada
6,903,345 B2 6/2005 Ono
6,903,353 B2 6/2005 Muraki
6,917,045 B2 7/2005 Hashimoto
6,919,574 B2 7/2005 Hashimoto
6,943,349 B2 9/2005 Adamec
6,953,938 B2 10/2005 Iwasaki
6,989,546 B2 1/2006 Loschner et al.
6,992,290 B2 1/2006 Watanabe
7,005,658 B2 2/2006 Muraki
7,015,467 B2 3/2006 Maldonado
7,015,482 B2 3/2006 Sohda et al.
7,034,321 B2 4/2006 Takakuwa et al.
7,060,984 B2 6/2006 Nagae
7,067,830 B2 6/2006 Yoda et al.
7,084,411 B2 8/2006 Lammer-Pachlinger
7,084,414 B2 8/2006 Wieland et al.
7,091,504 B2 8/2006 Wieland
7,109,494 B2 9/2006 Ono
7,126,141 B2 10/2006 Ono
7,129,502 B2 10/2006 Kruit
7,244,949 B2 7/2007 Knippelmeyer
7,285,779 B2 10/2007 Litman
7,332,730 B2 2/2008 Heinitz et al.
7,375,326 B2 5/2008 Sender
7,420,164 B2 9/2008 Nakasuji
7,468,507 B2 12/2008 Rogers
7,504,622 B2 3/2009 Elyasaf
7,535,001 B2 5/2009 Sender
7,569,833 B2 8/2009 Kruit
7,601,972 B2 10/2009 Nakasuji
7,619,203 B2 11/2009 Elyasaf
7,696,497 B2 4/2010 Rogers
7,868,307 B2 1/2011 Kruit
8,035,082 B2 10/2011 Yamazaki
8,134,135 B2 3/2012 Kruit
8,350,214 B2 1/2013 Otaki
8,362,425 B2 1/2013 Han
8,384,051 B2 2/2013 Ozawa
8,598,525 B2 12/2013 Zeidler
8,618,496 B2 12/2013 Wieland
8,637,834 B2 1/2014 Knipplemeyer et al.
8,648,318 B2 2/2014 Kruit et al.
8,704,192 B2 4/2014 Sano
8,748,842 B2 6/2014 Ohashi
8,779,399 B2 7/2014 Yamanaka
8,829,465 B2 9/2014 Tsunoda
8,890,094 B2 11/2014 Wieland et al.
8,946,631 B2 2/2015 Noji et al.
8,946,632 B2 2/2015 Federici et al.
8,963,099 B2 2/2015 Yamada
9,153,413 B2 10/2015 Almogy
9,263,233 B2 2/2016 Zeidler
9,336,981 B2 5/2016 Knippelmeyer
9,336,982 B2 5/2016 Zeidler
9,349,571 B2 5/2016 Kemen
9,368,314 B2 6/2016 Nakasuji
9,513,113 B2 12/2016 Yang et al.
9,530,613 B2 12/2016 Rogers
9,536,702 B2 1/2017 Lang
9,607,805 B2 3/2017 Liu
9,607,806 B2 3/2017 Zonnevylle et al.
9,653,254 B2 5/2017 Zeidler
9,702,983 B2 7/2017 Eder
9,922,796 B1 3/2018 Frosien et al.
9,922,799 B2 3/2018 Li
9,991,089 B2 6/2018 Mueller
10,062,541 B2 8/2018 Ren
10,141,160 B2 11/2018 Ren
10,163,603 B2 12/2018 Zeidler et al.
10,176,965 B1 1/2019 Breuer
10,242,839 B2 3/2019 Brodie
10,312,052 B2 6/2019 Kruit
10,354,831 B2 7/2019 Kemen
10,388,487 B2 8/2019 Zeidler
10,395,887 B1 8/2019 Kruit et al.
10,453,645 B2 10/2019 Frosien et al.
10,497,536 B2 12/2019 Brodie
10,504,687 B2 12/2019 Kruit et al.
10,535,494 B2 1/2020 Zeidler
10,541,112 B2 1/2020 Schubert
10,586,677 B1 3/2020 Okada
10,600,613 B2 3/2020 Zeidler
10,622,184 B2 4/2020 Knippelmeyer
10,643,820 B2 5/2020 Ren
10,741,355 B1 8/2020 Zeidler
10,748,739 B2 8/2020 Jiang et al.
10,811,215 B2 10/2020 Zeidler
10,854,423 B2 12/2020 Sarov
10,879,031 B2 12/2020 Ren
10,896,800 B2 1/2021 Riedesel
10,903,042 B2 1/2021 Kruit et al.
11,056,312 B1 7/2021 Jiang et al.
11,651,934 B2 5/2023 Jiang et al.
2003/0001095 A1 1/2003 Lo et al.
2006/0289804 A1 12/2006 Knipplemeyer
2008/0023643 A1 1/2008 Kruit et al.
2008/0230711 A1 9/2008 Platzgummer

(56) References Cited

U.S. PATENT DOCUMENTS

| | | | | |
|---|---|---|---|---|
| 2009/0014649 | A1 | 1/2009 | Nakasuji | |
| 2012/0107748 | A1 | 5/2012 | Morita | |
| 2012/0211677 | A1 | 8/2012 | Kruit et al. | |
| 2012/0295203 | A1 | 11/2012 | Sano | |
| 2014/0151570 | A1 | 6/2014 | Kato et al. | |
| 2014/0197325 | A1 | 7/2014 | Kato | |
| 2015/0069235 | A1 | 3/2015 | Kemen et al. | |
| 2016/0155603 | A1* | 6/2016 | Zeidler .................. | B82Y 10/00 250/396 R |
| 2016/0268096 | A1 | 9/2016 | Ren et al. | |
| 2017/0025241 | A1 | 1/2017 | Li | |
| 2017/0025243 | A1 | 1/2017 | Ren et al. | |
| 2017/0133198 | A1 | 5/2017 | Kruit | |
| 2017/0229279 | A1 | 8/2017 | Brodie et al. | |
| 2017/0243717 | A1 | 8/2017 | Kruit | |
| 2018/0254167 | A1 | 9/2018 | Zhao et al. | |
| 2019/0333732 | A1 | 10/2019 | Ren | |
| 2020/0051779 | A1 | 2/2020 | Ren et al. | |
| 2020/0126752 | A1 | 4/2020 | Brodie | |
| 2020/0211810 | A1 | 7/2020 | Zeidler | |
| 2020/0243300 | A1 | 7/2020 | Zeidler | |
| 2020/0273667 | A1 | 8/2020 | Mohammadi-Gheidari et al. | |
| 2020/0286707 | A1 | 9/2020 | Maassen et al. | |
| 2020/0373116 | A1 | 11/2020 | Zeidler | |
| 2021/0005423 | A1 | 1/2021 | Zeidler | |
| 2021/0035773 | A1 | 2/2021 | Zeidler | |
| 2022/0130640 | A1 | 4/2022 | Fritz et al. | |
| 2022/0139665 | A1 | 5/2022 | Schubert et al. | |

FOREIGN PATENT DOCUMENTS

| | | | |
|---|---|---|---|
| DE | 10 2013 014 976 | A1 | 3/2015 |
| DE | 10 2014 008 105 | A1 | 12/2015 |
| DE | 10 2014 008 383 | A1 | 12/2015 |
| DE | 10 2020 107 738 | B3 | 1/2021 |
| DE | 10 2019 005 362 | A1 | 2/2021 |
| GB | 2519511 | A | 4/2015 |
| GB | 2521819 | A | 7/2015 |
| JP | 59184524 | A | 10/1984 |
| JP | 60042825 | A | 3/1985 |
| JP | 60105229 | A | 6/1985 |
| JP | 61263217 | A | 11/1986 |
| JP | 2014229481 | A | 12/2014 |
| NL | 2016853 | B1 | 12/2017 |
| NL | 2020465 | B1 | 8/2019 |
| TW | 201820374 | A | 6/2018 |
| TW | 201921155 | A | 6/2019 |
| WO | WO 2005/024881 | A2 | 3/2005 |
| WO | WO 2007/028595 | | 3/2007 |
| WO | WO 2007/028596 | | 3/2007 |
| WO | WO 2007/060017 | | 5/2007 |
| WO | WO 2011/124352 | | 10/2011 |
| WO | WO2013032949 | A1 | 3/2013 |
| WO | WO 2018122176 | A1 | 7/2018 |
| WO | WO2020057678 | A1 | 3/2020 |
| WO | WO2020064035 | A1 | 4/2020 |
| WO | WO2020065094 | A1 | 4/2020 |
| WO | WO2020070074 | A1 | 4/2020 |
| WO | WO2020151904 | A2 | 7/2020 |
| WO | WO2020249147 | A1 | 12/2020 |
| WO | 2021018332 | A | 2/2021 |
| WO | WO 2021/018327 | A1 | 2/2021 |
| WO | 2021078352 | A1 | 4/2021 |
| WO | WO 2021/185481 | A1 | 9/2021 |

OTHER PUBLICATIONS

Office Action in Chinese Appln. No. 202080054443.2, dated Jan. 24, 2025, 20 pages (with English translation).

PCT/US2022/043559, International Search Report and Written Opinion of the International Searching Authority, Jan. 4, 2023.

A. Halavanau et al., "Spatial Control of Photoemitted Electron Beams using a Micro-Lens-Array Transverse-Shaping Technique," Phys Rev Accel Beams 20, 103404 (Oct. 26, 2017).

Translation of International Search Report for PCT Appl No. PCT/DE2020/000174, dated Nov. 9, 2020.

Korean examination report, with translation thereof, for KR Appl No. 10-2022-7006307, dated Feb. 14, 2024.

Office Action in Chinese Appln. No. 202080054443.2, mailed on Mar. 26, 2026, 9 pages (with English translation).

* cited by examiner

METHOD FOR OPERATING A MULTIPLE PARTICLE BEAM SYSTEM WHILE ALTERING THE NUMERICAL APERTURE, ASSOCIATED COMPUTER PROGRAM PRODUCT AND MULTIPLE PARTICLE BEAM SYSTEM

CROSS-REFERENCE TO RELATED APPLICATIONS

The present application is a continuation of, and claims benefit under 35 USC 120 to, U.S. application Ser. No. 17/572,767, filed Jan. 11, 2022, which is a continuation of, and claims benefit under 35 USC 120 to, international application PCT/DE2020/000174, filed Jul. 29, 2020, which claims benefit under 35 USC 119 of German Application No. 10 2019 005 362.1, filed Jul. 31, 2019. The entire disclosure of these applications are incorporated by reference herein.

FIELD

The disclosure relates to particle beam systems which operate with a multiplicity of particle beams.

BACKGROUND

Similar to single-beam particle microscopes, multi-beam particle microscopes can be used to analyze objects on a microscopic scale. Images of an object that represent a surface of the object, for example, can be recorded using these particle microscopes. In this way, for example the structure of the surface can be analyzed. While in a single-beam particle microscope an individual particle beam of charged particles, such as electrons, positrons, muons or ions, is used to analyze the object, in a multi-beam particle microscope, a plurality of particle beams are used for this purpose. The plurality of the particle beams, also referred to as a bundle, are directed onto the surface of the object at the same time, which can allow for a significantly larger area of the surface of the object to be sampled and analyzed compared to a single-beam particle microscope within the same period of time. WO 2005/024 881 A2 discloses a multiple particle beam system in the form of an electron microscopy system which operates with a multiplicity of electron beams in order to scan an object to be examined using a bundle of electron beams in parallel. The bundle of electron beams is generated by an electron beam generated by an electron source being directed onto a multi-aperture plate having a multiplicity of openings. One portion of the electrons of the electron beam impinges the multi-aperture plate and is absorbed there, and another portion of the beam passes through the openings in the multi-aperture plate, such that an electron beam is shaped in the beam path downstream of each opening, the cross section of the electron beam being defined by the cross section of the opening. Furthermore, suitably chosen electric fields provided in the beam path upstream and/or downstream of the multi-aperture plate have the effect that each opening in the multi-aperture plate acts as a lens on the electron beam passing through the opening, such that the electron beams are focused in a plane situated at a distance from the multi-aperture plate. The plane in which the foci of the electron beams are formed is imaged by a downstream optical unit onto the surface of the object to be examined, such that the individual electron beams impinge the object in a focused manner as primary beams. There they generate interaction products, such as backscattered electrons or secondary electrons, emanating from the object, which are shaped to form secondary beams and are directed onto a detector by a further optical unit. There each of the secondary beams impinges a separate detector element such that the electron intensities detected by the detector element provide information relating to the object at the site at which the corresponding primary beam impinges the object. The bundle of primary beams is scanned systematically over the surface of the object in order to generate an electron micrograph of the object in the manner that is customary for scanning electron microscopes.

A high resolution within the scope of the particle-optical imaging in the described multiple particle beam system is, in general, highly relevant in practice. The value of the numerical aperture can be decisive for a good resolution. The numerical aperture is usually optimized by the optical designer when designing the system in order to obtain the best-possible resolution. The resolution is generally composed of a plurality of contributions, such as, for example, the magnification or reduction of the virtual diameter of the particle source, the diffraction and the aberrations of particle-optical components, with these contributions being dependent on the numerical aperture in different ways. Moreover, there is generally a dependence of these contributions on the respective working point of the multiple particle beam system, which may be characterized, for example, by the beam current intensity and/or the landing energy of the particles on the object. At a given working point and at set system parameters (e.g., aberration coefficients, brightness of the source), there is usually in any case a value for the numerical aperture at the sample, for which the spot size of the individual particle beams on the object is minimal. Here, the numerical aperture is typically only optimized for one working point of the system and, here too, the numerical aperture might not be optimal for this one working point in some cases, despite all the calculations.

SUMMARY

It is desirable to be able to alter the numerical aperture of the multiple particle beam system. This would allow an improvement in, or optimization of, the resolution during operation.

In an aspect, the disclosure allows for altering the numerical aperture (NA) of the individual particle beams in the object plane without a change in the beam pitch between the individual particle beams as a result thereof. The selective increase of the numerical aperture can have the desirable effect of achieving a smaller spot size of the illumination spots of the individual particle beams on a sample in the process, and hence can improve the resolution during the imaging if the aberrations in the imaging optical unit do not become too large. Therefore, altering the numerical aperture, in particular increasing the latter, can be desirable, in particular, for particle beam systems with an improved correction, for example with reduced beam dispersion or reduced spherical aberration.

The present disclosure seeks to provide a method for operating a multiple particle beam system which allows the variation of the numerical aperture, optionally in a particularly simple manner and without undertaking structural modifications on the multiple particle beam system, with other particle-optical parameters such as, e.g., the pitch of the individual particle beams when incident on the sample nevertheless not being altered.

Here, the disclosure is partially based on the following considerations: A multiple particle beam system operating with a single column has a multi-beam generator for generating a multiplicity of individual particle beams from a single particle beam. Here, this multi-beam generator can include a multi-aperture plate in combination with a multi-lens array and/or a multi-deflector array. Thus, as a result of the multi-beam generator, the multiplicity of individual particle beams can be generated and imaged onto an intermediate image plane. This intermediate image plane can be a real intermediate image plane or a virtual intermediate image plane. In both cases, the locations of the individual particle beams in the intermediate image can be considered to be virtual particle sources and can consequently be considered to be origins for the further particle-optical imaging. The virtual particle sources in this intermediate image plane can consequently be imaged onto an object or into the object plane and the object to be examined can be scanned using the multiplicity of individual particle beams.

The following conserved quantity applies within the scope of particle-optical imaging of the virtual particle sources onto the object plane:

$$NA \times Pitch \times \sqrt{U} = const \tag{1}$$

where NA denotes the numerical aperture, pitch denotes the distance between the adjacent individual particle beams and U denotes the electric potential in an intermediate image plane or in the object plane. Here, as is conventional in electron-optical theory, the electric potentials U are related to the zero of the kinetic energy of the particles, i.e., the zeros of the electric potentials correspond to the zero of the kinetic energy of the particles. If the numerical aperture and the voltage are not altered, the value of the conserved quantity can nevertheless be set by altering the pitch of adjacent individual particle beams. This altered value of the conserved quantity can then apply to the particle-optical imaging overall, i.e., it can also apply in each intermediate image plane or in the object plane.

If the situation in the intermediate image plane (labeled by the index 1) and in the object plane (labeled by the index 2) is now considered, the following applies:

$$NA1 \times Pitch1 \times \sqrt{U1} = NA2 \times Pitch2 \times \sqrt{U2} \tag{2}$$

Rewriting equation (2) and solving for the numerical aperture related to the object plane yields:

$$NA2 = \frac{NA1 \times Pitch1 \times \sqrt{U1}}{Pitch2 \times \sqrt{U2}} \tag{3}$$

If the electric potential U2 and the beam pitch between adjacent individual particle beams in the object plane Pitch2 is kept constant, it is possible, from equation (3), to read off the various options of how the numerical aperture NA2 could be set:

It is possible to alter the numerical aperture related to the intermediate image plane, e.g., by varying the aperture diameter of the multi-aperture plate of the multi-beam generator.

It is possible to use a different multi-beam generator with different pitches between the openings in the multi-aperture plate, as a result of which the beam pitch between adjacent individual particle beams in the intermediate image plane is altered.

It is also possible to alter the electric potential in the intermediate image by way of a special booster electrode.

The first two proposed solutions can be disadvantageous in that the multi-aperture plate is replaced for every change in the working point, which is time-consuming and, in the worst case, may even lead to a readjustment of the system becoming desirable. The third solution would involve a new high-voltage device and would introduce additional aberrations.

Unlike in individual beam systems, the numerical aperture or the pitch of the individual beams cannot, in general, simply be altered in multi-beam systems with a multiplicity of individual beams in a grid arrangement. The beam pitch or pitch of the grid arrangement of the multiplicity of individual beams is, in general, fixedly specified by way of a multi-aperture plate. The multi-aperture plate generates a multiplicity of beam focus points in an intermediate image plane, for example N focus points in one direction with pitch P1 and a numerical aperture of an individual beam NA1. If the imaging system disposed downstream of the multi-aperture plate has an imaging scale M1, the numerical aperture in the image plane is $NA2=NA1/M1\times\sqrt{U1/U2}$ and the pitch P2 on the sample is P2=M1*P1. Thus, pitch and NA are coupled to one another and cannot be altered independently of one another. Therefore, the issue of NA change occurs in the case of multi-beam microscopes, which image a multiplicity of individual beams through a common optical unit. In general, an NA change leads to a change in the beam pitch, which is undesirable. Therefore, many conventional multi-beam microscopes do not allow changing the numerical aperture without changing the pitch at the same time.

It is often advantageous to distribute as many beams as possible over a specified area. However, in general, the detection path is separate the associated secondary beams, in particular while taking account of the energy spectra of the secondary electrons (SE). This can yield a minimum pitch. This minimum pitch can depend on the performance (aberrations) of the imaging optical unit, the sample (energy spectrum of the SE) and the contrasts to be imaged (filtering of the energy spectra of the SE). There are critical samples involving a greater pitch and good-tempered samples where work can be carried out with a smaller pitch. Flexibility that is adaptable to the sample can be desirable here and the exemplary embodiments of the disclosure can render it possible to set the pitch of the grid arrangement and the numerical aperture of the individual beams independently of one another. A special case where the pitch is kept constant is considered below. In an equivalent embodiment, the numerical aperture can be kept constant and the pitch can be altered. In a further equivalent embodiment, the numerical aperture and pitch can be altered independently of one another; for example, both are increased or reduced.

Beyond the multi-aperture plate there is an imaging system, which images the multiplicity of beam focus points into an image plane in which the object is disposed. The imaging system includes successively disposed electron-optical imaging components and forms a conservative system with the Helmholtz-Lagrange invariant $HLI=NA1\times N\times P1\times\sqrt{U1}$ as conserved quantity. A characteristic of a so-called conservative imaging system is that the HLI remains unchanged; i.e., a change in the numerical aperture on the sample as a result of changing the imaging scale always also changes the pitch of the multiplicity of individual beams in the case of an unchanged voltage.

Changing the NA without changing the pitch and without changing the voltage ratios U1/U2 therefore involves changing HLI1 into HLI2.

One solution for changing the HLI1 lies in providing a multi-aperture plate with a different pitch, for example by way of an exchange. However, the disclosure seeks to provide an NA change, for example, without changing the pitch and without exchanging the multi-aperture plate.

According to the disclosure, an inventive combination of a novel multi-aperture plate arrangement (a novel multi-beam generator) with a downstream electron beam optical unit which has been configured.

The inventors have developed a new option for altering the numerical aperture NA2 without changing the pitches between the openings or the diameter of the openings of the multi-aperture plate. Here, the beam pitch between adjacent individual particle beams in the intermediate image plane is altered, with the beam pitch between adjacent individual particle beams (Pitch2) in the object plane being kept constant at the same time. It is not necessary to exchange the multi-aperture plate in the process; instead, the effects of particle-optical components, in particular of the multi-beam generator, can be set differently. In order to set the beam pitch in the intermediate image plane, it can be desirable for at least one additional particle-optical component in order, even in the case of a change in the beam pitch in the intermediate image plane, to be able to set the other particle-optical parameters, which characterize the particle-optical imaging, independently of one another or keep these constant. By way of example, this additional particle-optical component can be an additional electrostatic or magnetic field lens, or else a different particle-optical component or arrangement of particle-optical components.

According to an embodiment, a multi-beam generator with a multi-aperture plate and with a multi-deflector array allows the pitch of the individual particle beams to be altered in the intermediate image plane without changing the NA.

According to an embodiment, a multi-beam generator with a multi-aperture plate and with an electron-optical lens (counter electrode) disposed downstream thereof allows the numerical aperture to be changed in the object plane without simultaneously changing the pitch in the object plane. Here, an additional independent focal length change can be achieved by way of an optional additional micro-lens array.

In a first aspect, the disclosure provides a method for operating a multiple particle beam system, wherein the particle-optical system includes a plurality of particle-optical components, which include a multi-beam generator for generating a multiplicity of individual particle beams from one particle beam and which are substantially passed through by the individual particle beam or by the multiplicity of individual particle beams, and wherein the effects of the particle-optical components on the individual particle beam or on the multiplicity of individual particle beams are adjustable, and wherein the method includes the following steps:

defining a first working point of the system;

setting the effects (W11 . . . Wn1) of the particle-optical components at the first working point of the system in such a way that a first plane with particles of the individual particle beams is imaged in particle-optical fashion into a second plane, wherein, when applying the settings for the first working point, the particle-optical imaging is characterizable, in particular completely characterizable, by way of a multiplicity of n mutually independently adjustable particle-optical parameters p (p11 . . . pn1), where p11 represents the beam pitch between adjacent individual particle beams in the first plane, p21 represents the beam pitch between adjacent individual particle beams in the second plane, and p31 represents the numerical aperture of the multi-beam particle optical unit in relation to the second plane, and wherein the values of the following parameters are altered when setting the effects (W11 . . . Wn1) at the first working point:

the beam pitch between adjacent individual particle beams in the first plane, i.e., p11, and the numerical aperture of the multi-beam particle optical unit in relation to the second plane, i.e., p31, and wherein the values of the remaining parameters p are kept substantially constant when setting the effects (W11 . . . Wn1) at the first working point and consequently the following parameter p is also kept substantially constant:

the beam pitch between adjacent individual particle beams in the second plane, i.e., p21.

In the notation used above, the second index always relates to the working point while the first index of each parameter is numbered consecutively in accordance with the number of parameters.

The charged particles can be for example electrons, positrons, muons or ions or other charged particles. Optionally, the charged particles are electrons generated, for example, using a thermal field emission source (TFE). However, other particle sources can also be used.

The virtual particle sources, which are generated by a multiple image representation (multi-image) of the individual particle source, are located in the first plane. The second plane is the object plane, into which the virtual particle sources are imaged in turn.

Particle-optical parameters p are altered or kept constant when setting the effects. At least at the end of a setting procedure, the particle-optical parameters p that are altered therefore have different values than at the start of the setting procedure. Accordingly, particle-optical parameters p that are kept constant have, at least at the end of the setting procedure, substantially the same value as at the start of the setting procedure.

The particle-optical imaging is characterized, for example completely characterized, by n mutually independently adjustable particle-optical parameters p. Therefore, all particle-optical parameters of interest can be characterized. There could also be further parameters which are not of interest. If the characterization of the particle-optical imaging is complete, the number n of mutually independently adjustable particle-optical parameters describes the minimum number of parameters p which are used to achieve the desired characterization. If more particle-optical parameters m with $m \geq n$ are present, these m parameters must depend on one another at least in part. In order to be able to set the system to a certain value in the case of a multiplicity of n mutually independently adjustable particle-optical parameters p, the particle-optical components of the multiple particle beam system must thus have n effects, which can each be set independently of one another.

A special case, which is also included by the above-described general embodiment variant of the disclosure, is present when the particle-optical imaging is sufficiently well characterized by three mutually independently adjustable parameters p. Although further parameters may exist in this case, they are generally not of interest and are therefore not taken into any further account either within the scope of the characterization. Then, the type of the three parameters has already been established. Then, this relates to the following parameters:

p11, which represents the beam pitch between adjacent individual particle beams in the first plane, p21, which represents the beam pitch between adjacent individual particle beams in the second plane, and p31, which represents the numerical aperture of the multi-beam particle optical unit in relation to the second plane.

According to an embodiment of the disclosure, the number of mutually independently adjustable parameters p which are kept constant is smaller by at least one than the number of all effects Wij of the particle-optical components available in the system. The particle-optical effects are adjustment options for lenses and/or deflectors. For example, the particle-optical parameters p may be delimited from mechanical parameters or parameters relating to the working point setting of the system.

According to an embodiment of the disclosure, the pitch between the individual particle beams in the first plane is substantially varied by setting an effect on the multi-beam generator and/or the focus in the second plane is substantially set by setting an effect at a different particle-optical component to the multi-beam generator, in particular by setting an effect at a field lens. It is often the case in conventional multiple particle beam systems that the focus of the particle-optical imaging in the second plane is set with the aid of the multi-beam generator (in addition to its function of generating individual particle beams). According to the disclosure, the pitch of the individual particle beams in the first plane can be varied via the multi-beam generator. On account of this, a different particle-optical component, which adopts the focus-setting function of the multi-beam generator, can be used to also allow the focus to be set (optionally be set again) in the first plane, in addition to the pitch of the individual particle beams being varied. The aforementioned field lens represents a simple particle-optical component for this focus setting. As an alternative thereto, use can be made of an objective lens or any other particle-optical component to this end.

According to an embodiment of the disclosure, the multi-beam generator includes a multi-lens array. According to an embodiment of the disclosure, the multi-lens array includes a multi-aperture plate and an electron-optical lens (counter electrode), which is disposed downstream of the multi-aperture plate in the direction of the beam path of the individual particle beams. Here, the multi-aperture plate can be at ground potential; however, a different potential can also be applied to the multi-aperture plate. Moreover, the electron-optical lens can be at a high-voltage potential, for example at a potential between 10 kV and 20 kV. A variation of the pitch of the individual particle beams in the first plane by setting a variation on the multi-beam generator can then be implemented by setting an effect on the electron-optical lens. By way of example, the applied high-voltage potential can be varied in the process.

According to an embodiment of the disclosure, the multi-lens array moreover includes a micro-lens array with a multiplicity of openings, which is disposed upstream of the multi-aperture plate in the direction of the beam path. This micro-lens array can be at a potential of a few 100 V, for example at a potential of approximately 100 V, 200 V, 300 V or 400 V. A variation of the pitch of the individual particle beams in the first plane by setting a variation on the multi-beam generator can then be implemented by setting an effect on the micro-lens array. Here, it is not absolutely necessary to also set an effect on the electron-optical lens (counter electrode); however, this can be additionally implemented.

According to an embodiment of the disclosure, the multi-beam generator includes a multi-aperture plate and a multi-deflector array disposed downstream thereof in relation to the beam path of the individual particle beams. A variation of the pitch of the individual particle beams in the first plane by setting a variation on the multi-beam generator can then be implemented by setting an effect on the multi-deflector array.

According to an embodiment of the disclosure, the numerical aperture in the second plane (object plane) is optimized within the scope of the method. This optimization of the numerical aperture can be direct or indirect. Hence, it is not necessary for the numerical aperture to be actually determined or measured to this end. Instead, it is also possible to measure a different variable which, in general, is related to the numerical aperture.

According to an embodiment of the disclosure, the method according to the disclosure is used to vary the numerical aperture in the second plane (object plane) by at least 10%, such as by at least 15%. Here, the percentage change relates to possible values for the numerical aperture in the second plane that are able to be set. It is possible that these two values are assigned to different working points of the system. However, it is also possible for the two values to describe the variation of the numerical aperture at a fixed working point.

According to an embodiment of the disclosure, the resolution of the particle-optical imaging is optimized. The resolution can be ascertained by measurements and is therefore particularly easily open to an optimization.

According to an embodiment of the disclosure, the effects at the first working point are set iteratively. Thus, the sought-after setting is approached incrementally. Iterative methods can be used for the operation of the multiple particle beam system since the setting of a single effect of a particle-optical component usually makes an impact, to some extent, on significantly more than a single parameter p. Thus, this is due to the complexity of the multiple particle beam system as such.

According to an embodiment of the disclosure, no mechanically adjustable parameter k is altered on the particle-optical system; and/or neither a diameter of holes in a multi-aperture plate of the multi-beam generator nor the pitches thereof in relation to one another are altered; and/or the multi-beam generator or one of its components is not structurally modified, not replaced in full or in part and not displaced in terms of its position; and/or the position of the second plane and of the object remains unaltered. Here, the elegance of the method according to the disclosure is particularly evident: a variation in the numerical aperture while keeping the beam pitch of adjacent individual particle beams in the second plane (object plane) constant can be brought about solely by the setting of effects of the particle-optical components. Consequently, the method according to the disclosure can operate very efficiently, quickly and precisely.

According to a further embodiment of the disclosure, a working point is defined by at least one of the following parameters: beam current intensity, landing energy, position of the object, diameter of the individual beam source. Here, the diameter of the virtual particle sources is influenced by the diameter of the individual beam source. A variation of the beam current intensity has an influence on the resolution and throughput when scanning an object. A variation in the landing energy has an influence on the penetration depth into the object.

According to an embodiment of the disclosure, setting the effects respectively includes the setting of a voltage and/or of a current.

According to an embodiment variant of the disclosure, the parameters p describe particle-optical properties of the multi-beam particle optical unit, in particular the beam pitch of the individual particle beams in the first plane, the beam pitch of the individual particle beams in the second plane, a relative position of the second plane (object plane, focus plane), telecentricity of the individual particle beams when incident on the second plane and/or rotation of the individual particle beams when incident on the second plane.

According to an embodiment of the disclosure, the first plane is an intermediate image plane and/or the second plane is an object plane (sample plane). The virtual particle sources are situated in the intermediate image plane.

According to an embodiment of the disclosure, the multi-beam generator includes a multi-lens array and/or the image in the first plane is a real intermediate image. Alternatively, the multi-beam generator includes a multi-deflector array and/or the image in the first plane is a virtual intermediate image. In both cases, the virtual particle sources are located in the first plane. Thus, the method according to the disclosure is usable in multiple particle beam systems that are very different from a structural point of view and consequently it is advantageously very flexible.

According to an embodiment of the disclosure, the method furthermore includes the following:

- defining a second working point of the system;
- setting the effects (W12 . . . Wn2) of the particle-optical components at the second working point of the system in such a way that the first plane with particles of the individual particle beams is imaged in particle-optical fashion into the second plane, wherein, when applying the settings for the second working point, the particle-optical imaging is once again characterizable by the n particle-optical parameters p (p12 . . . pn2), and wherein

- p12 represents the beam pitch between adjacent individual particle beams in the first plane,
- p22 represents the beam pitch between adjacent individual particle beams in the second plane, and
- p32 represents the numerical aperture of the multi-beam particle optical unit in relation to the second plane, wherein the values of the following parameters are altered in comparison with their values at the first working point of the system when applying the settings at the second working point:

- the beam pitch between adjacent individual particle beams in the first plane, i.e., p12/p11 and
- the numerical aperture of the multi-beam particle optical unit in relation to the second plane, i.e., p32/p31, and wherein the values of the remaining parameters p are kept substantially constant in comparison with their values at the first working point of the system when applying the settings at the second working point and consequently the following parameter p is also kept substantially constant:

- the beam pitch between adjacent individual particle beams in the second plane, i.e., p22=p21.

Setting the effects of the particle-optical components at the second working point is thus implemented, in general, in completely analogous fashion to the setting of the effects of the particle-optical components at the first working point. Accordingly, it is also possible to define a third working point, a fourth working point, a fifth working point and further working points and to set the effects at these working points. Optionally, the effects at the second working point, at a third working point, fourth working point, fifth working point and/or one or more further working points are set iteratively.

According to an embodiment of the disclosure, the method is carried out multiple times in full or in part. In particular, this can relate to settings for a plurality of working points; however, this could also relate to the iterative embodiment of a setting procedure. Moreover, it is possible for a setting to be repeated if the found setting does not yield the desired result for whatever reason.

According to an embodiment of the disclosure, the ascertained effects, in particular currents and/or voltages, for one or more working points are stored in a lookup table. In this case, the effects for a first working point may have already been entered into this lookup table in advance since these values are already known from the optics design. However, the effects at the first working point may yet have to be ascertained and the (optimal) effects may yet have to be set. Storing the values of effects for one or more working points in a lookup table can be desirable because the multiple particle beam system can be operated very quickly in optimal fashion at different working points. Thus, every change in a working point does not necessitate a renewed setting of the entire system or a renewed optimization with respect to the resolution. Thus, the method according to the disclosure can serve to adjust the multiple particle beam system at a plurality of working points. Then, selecting a working point can allow an immediate start of the measuring process in subsequent measurements, with optimal settings of the effects which were determined and stored in advance.

In an aspect, the disclosure provides a computer program product having a program code for carrying out the method as per any one of the embodiment variants described above. In this case, the program code can be subdivided into one or more partial codes. By way of example, the code for controlling the multiple particle beam system could be provided separately in a program part, while another program part contains the routines for operating the multiple particle beam system within the scope of the adjustment described above.

In an aspect, the disclosure provides a multiple particle beam system, for example for carrying out the method as described in conjunction with the first aspect of the disclosure, the multiple particle beam system including the following:

- a first multi-beam particle optical unit with particle-optical components, which includes a multi-beam generator for generating a multiplicity of individual particle beams from one particle beam and which is configured to direct the individual particle beams onto an object; and
- a controller;
- wherein the controller is configured to set the effects of the particle-optical components of the first multi-beam particle optical unit on the individual particle beams at a first working point in such a way that a first plane with particles of the individual particle beams is imaged in particle-optical fashion into a second plane, wherein the second plane coincides with the plane of the object; and wherein the controller is further configured to vary the beam pitch between adjacent individual particle beams in the first plane, keep the beam pitch between adjacent individual particle beams in the second plane constant and vary the numerical aperture in relation to the second plane.

Moreover, it is possible for the controller to likewise keep all remaining particle-optical parameters p, which characterize the particle-optical imaging, constant and for the controller to set the effects of the particle-optical components accordingly such that this goal is realized. Varying the numerical aperture in relation to the second plane can be optimizing the numerical aperture.

In relation to the definitions of the particle-optical components, what was already explained in conjunction with the method according to the disclosure applies accordingly.

In relation to the remaining definitions and terminology, too, what was already explained in conjunction with the method according to the disclosure applies accordingly.

The control of the multiple particle beam system can be effected in computer-implemented fashion. For example, the control can be configured to carry out the method according to the disclosure—as described above.

According to an embodiment of the disclosure, the controller of the multiple particle beam system is configured so that the variation of the pitch between the individual particle beams in the first plane is substantially set by setting an effect on the multi-beam generator and/or the controller is configured in such a way that the focus in the second plane is substantially set by setting an effect at a different particle-optical component to the multi-beam generator, in particular by setting an effect at a field lens.

According to an embodiment of the disclosure, the multi-beam generator includes a multi-lens array. According to an embodiment of the disclosure, the multi-lens array includes a multi-aperture plate and an electron-optical lens (counter electrode), which is disposed downstream of the multi-aperture plate in the direction of the beam path of the individual particle beams. Here, the multi-aperture plate can be at ground potential; however, a different potential can also be applied to the multi-aperture plate. Moreover, the electron-optical lens can be at a high-voltage potential, for example at a potential between 10 kV and 20 kV. A variation of the pitch of the individual particle beams in the first plane by setting a variation on the multi-beam generator can then be implemented by setting an effect on the electron-optical lens via the controller. The applied high-voltage potential can be varied in the process.

According to an embodiment of the disclosure, the multi-lens array moreover includes a micro-lens array with a multiplicity of openings, which is disposed upstream of the multi-aperture plate in the direction of the beam path. This micro-lens array can be at a potential of a few 100 V, for example at a potential of approximately 100 V, 200 V, 300 V or 400 V. A variation of the pitch of the individual particle beams in the first plane by setting a variation on the multi-beam generator can then be implemented by setting an effect on the micro-lens array via the controller. Here, it is not absolutely necessary to also set an effect on the electron-optical lens (counter electrode); however, this can be additionally implemented.

According to an embodiment of the disclosure, the multi-beam generator includes a multi-aperture plate and a multi-deflector array disposed downstream thereof in relation to the beam path of the individual particle beams. A variation of the pitch of the individual particle beams in the first plane by setting a variation on the multi-beam generator can then be implemented by setting an effect on the multi-deflector array an embodiment the controller.

With the embodiments described, it is possible to set NA changes in the second plane (object plane) of ≥10%, such as of ≥15%. Here, the percentage change relates to possible values for the numerical aperture in the second plane that are able to be set. It is possible that these two values are assigned to different working points of the system. However, it is also possible for the two values to describe the possible variation of the numerical aperture at a fixed working point.

According to an embodiment of the disclosure, the multi-beam generator has a fixed arrangement in space relative to the remaining particle-optical components of the multiple particle beam system. Nor is there a mechanical change in the position of the object in the direction of the optical axis, i.e., in the working distance between the object surface and the objective lens. Thus, for setting the effects with the aid of the controller, it is not necessary to move the multi-beam generator or any other particle-optical component of the multiple particle beam system or the object in any way whatsoever.

According to an embodiment of the disclosure, the multi-beam generator includes a multi-lens array and/or the image in the first plane is a real intermediate image. Alternatively, the multi-beam generator includes a multi-deflector array and/or the image in the first plane is a virtual intermediate image. What also applies in both cases here is that virtual particle sources which are multiple images of the real particle source are located in the intermediate image plane. Thus, the multiple particle beam system can be realized flexibly.

According to an embodiment, the controller of the multiple particle beam system is further configured to optimize the resolution of the particle-optical imaging. The system can be provided with a feedback loop, for example, wherein the obtained resolution of the imaging is ascertained for different settings of effects and reported to the controller. If the value for the resolution converges in such an iterative process, the limit value is usually the optimized resolution.

According to an embodiment of the disclosure, the multiple particle beam system moreover has a memory with a lookup table, in which effects of the particle-optical components, in particular currents and/or voltages, for one or more working points are storable or stored. It is thus possible for the lookup table to be already provided with values; however, the lookup table may also only be set up in order then to be subsequently provided with values. In particular, these can be ascertained with the aid of the method according to the disclosure as per the first aspect of the disclosure. With respect to the working points, what was already explained in conjunction with the first aspect of the disclosure applies accordingly.

According to a further embodiment of the disclosure, the multiple particle beam system moreover has an input unit for selecting a working point from the lookup table. Here, it can be the case that, following the adjustment of the multiple particle beam system for a plurality of working points, a working point is selected from the lookup table for the subsequent actual recordings or measurements with the aid of the multiple particle beam system. Then, all effects of the particle-optical components are known for this working point, which effects are involved, for example, in order to operate the multiple particle beam system at an optimal resolution. The provision of an input unit can allow relatively flexible work with the aid of the multiple particle beam system in the case of different desired properties with respect to the scanning of an object.

Naturally, the multiple particle beam system could also be equipped with a second multi-beam particle optical unit which, for example, can enable the corresponding detection, in a spatially resolved fashion, of secondary electrons released from the object. Details with respect to appropriate optical units are found, for example, in the aforementioned WO 2005/024 881 A2.

According to an embodiment of the disclosure, the multi-beam generator has a multi-lens array, wherein a field lens system is disposed downstream of the multi-beam generator in the beam direction, the field lens system having at least four mutually independently adjustable particle lenses.

According to an embodiment of the disclosure, the multi-beam generator has a multi-deflector array, wherein a field lens system is disposed downstream of the multi-beam generator in the beam direction, the field lens system having at least three mutually independently adjustable particle lenses.

In an aspect, the disclosure provides the use of the multiple particle beam system, as described herein, for optimizing the numerical aperture and/or the resolution of the multiple particle beam system at a working point. The fact that the multiple particle beam system according to the disclosure allows the numerical aperture and/or the resolution of the multiple particle beam system to be set at a working point can be a substantial strength of the multiple particle beam system described. This can allow the best-possible recordings of objects to be taken.

Various embodiments of the disclosure can be combined in full or in part with one another, provided that no technical contradictions arise as a result.

BRIEF DESCRIPTION OF THE DRAWINGS

The disclosure will be understood even better with reference to the accompanying figures, in which.

DETAILED DESCRIPTION

Figure 1:
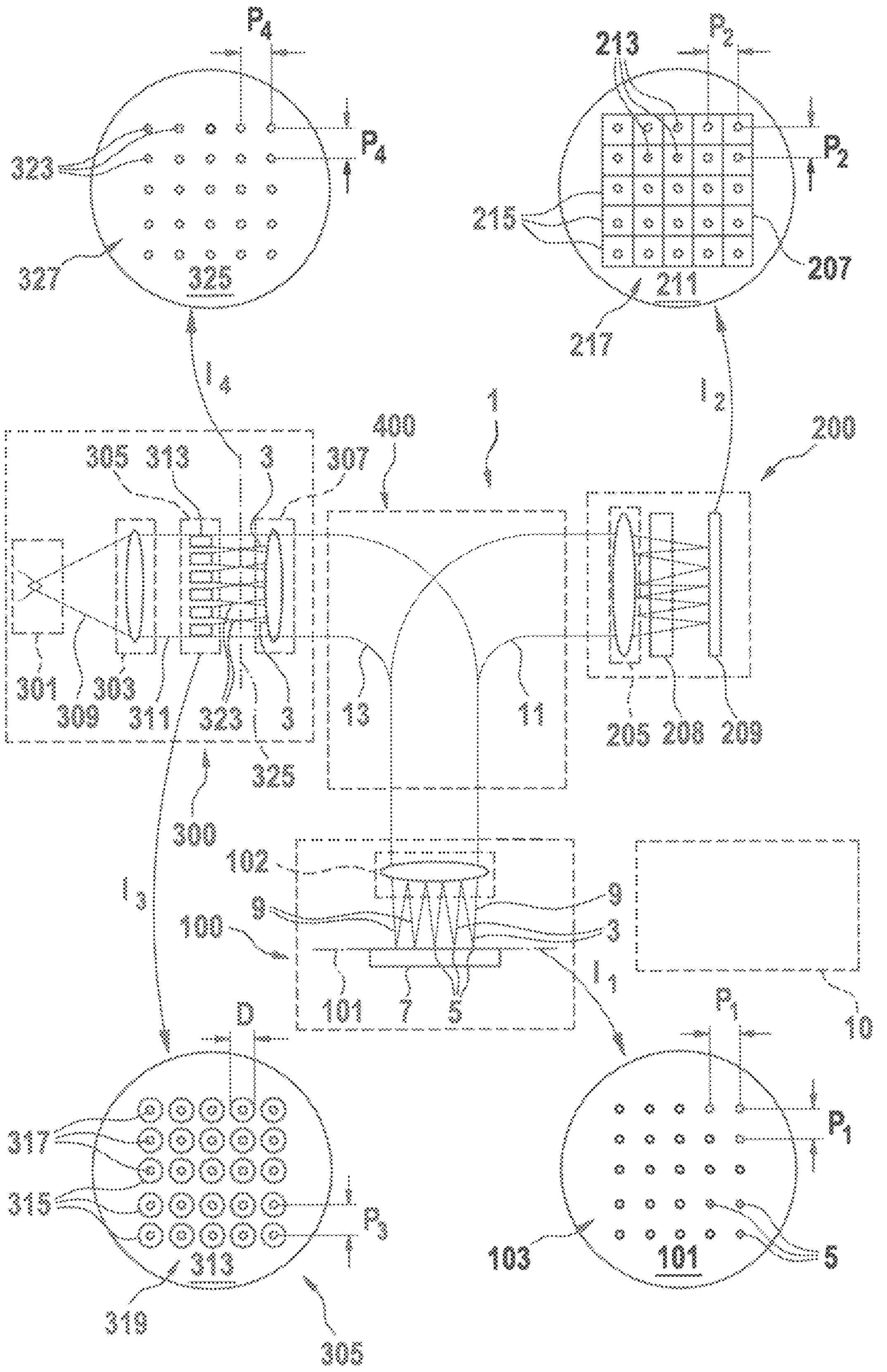
FIG. 1: shows a multi-beam particle microscope in a schematic illustration.

FIG. 1 is a schematic illustration of a particle beam system 1 in the form of a multi-beam particle microscope 1, which uses a multiplicity of particle beams. The particle beam system 1 generates a multiplicity of particle beams which impinge an object to be examined in order to generate there interaction products, e.g. secondary electrons, which emanate from the object and are subsequently detected. The particle beam system 1 is of the scanning electron microscope (SEM) type, which uses a plurality of primary particle beams 3 which are incident on a surface of the object 7 at a plurality of locations 5 and generate there a plurality of electron beam spots, or spots, that are spatially separated from one another. The object 7 to be examined can be of any desired type, e.g. a semiconductor wafer or a biological sample, and include an arrangement of miniaturized elements or the like. The surface of the object 7 is disposed in a first plane 101 (object plane) of an objective lens 102 of an objective lens system 100.

The enlarged excerpt $I_1$ in FIG. 1 shows a plan view of the object plane 101 having a regular rectangular field 103 of sites of incidence 5 formed in the first plane 101. In FIG. 1, the number of sites of incidence is 25, which form a 5×5 field 103. The number 25 of sites of incidence is a number chosen for reasons of simplified illustration. In practice, the number of beams, and hence the number of sites of incidence, can be chosen to be significantly greater, such as, for example, 20×30, 100×100 and the like.

In the embodiment illustrated, the field 103 of sites of incidence 5 is a substantially regular rectangular field having a constant pitch P1 between adjacent sites of incidence. Exemplary values of the pitch P1 are 1 micrometer, 10 micrometers and 40 micrometers. However, it is also possible for the field 103 to have other symmetries, such as a hexagonal symmetry, for example.

A diameter of the beam spots shaped in the first plane 101 can be small. Exemplary values of the diameter are 1 nanometer, 5 nanometers, 10 nanometers, 100 nanometers and 200 nanometers. The focusing of the particle beams 3 for shaping the beam spots 5 is carried out by the objective lens system 100.

The primary particles impinging the object generate interaction products, e.g. secondary electrons, back-scattered electrons or primary particles that have experienced a reversal of movement for other reasons, which emanate from the surface of the object 7 or from the first plane 101. The interaction products emanating from the surface of the object 7 are shaped by the objective lens 102 to form secondary particle beams 9. The particle beam system 1 provides a particle beam path 11 for supplying the multiplicity of secondary particle beams 9 to a detector system 200. The detector system 200 includes a particle optical unit having a projection lens 205 for directing the secondary particle beams 9 onto a particle multi-detector 209.

The excerpt $I_2$ in FIG. 1 shows a plan view of the plane 211, in which individual detection regions of the particle multi-detector 209 on which the secondary particle beams 9 are incident at the sites 213 are located. The sites of incidence 213 lie in a field 217 with a regular pitch $P_2$ with respect to one another. Exemplary values of the pitch $P_2$ are 10 micrometers, 100 micrometers and 200 micrometers.

The primary particle beams 3 are generated in a beam generating apparatus 300 including at least one particle source 301 (e.g., an electron source), at least one collimation lens 303, a multi-aperture arrangement 305 and a field lens 307, or a field lens system made of a plurality of field lenses. The particle source 301 generates a diverging particle beam 309, which is collimated or at least substantially collimated by the collimation lens 303 in order to shape a beam 311 which illuminates the multi-aperture arrangement 305.

The excerpt $I_3$ in FIG. 1 shows a plan view of the multi-aperture arrangement 305. The multi-aperture arrangement 305 includes a multi-aperture plate 313, which has a plurality of openings or apertures 315 formed therein. Midpoints 317 of the openings 315 are disposed in a field 319 that is imaged onto the field 103 formed by the beam spots 5 in the object plane 101. A pitch $P_3$ between the midpoints 317 of the apertures 315 can have exemplary values of 5 micrometers, 100 micrometers and 200 micrometers. The diameters D of the apertures 315 are smaller than the pitch $P_3$ between the midpoints of the apertures. Exemplary values of the diameters D are $0.2\times P_3$, $0.4\times P_3$ and $0.8\times P_3$. Particles of the illuminating particle beam 311 pass through the apertures 315 and form particle beams 3. Particles of the illuminating beam 311 which impinge the plate 313 are intercepted by the latter and do not contribute to the formation of the particle beams 3.

On account of an applied electrostatic field, the multi-aperture arrangement 305 focuses each of the particle beams 3 in such a way that beam foci 323 are formed in a plane 325. Alternatively, the beam foci 323 can be virtual. A diameter of the beam foci 323 can be, for example, 10 nanometers, 100 nanometers and 1 micrometer.

The field lens 307 and the objective lens 102 provide a first imaging particle optical unit for imaging the plane 325, in which the beam foci 323 are formed, onto the first plane 101 such that a field 103 of sites of incidence 5 or beam spots arises there. Should a surface of the object 7 be disposed in the first plane, the beam spots are correspondingly formed on the object surface.

The objective lens 102 and the projection lens arrangement 205 provide a second imaging particle optical unit for imaging the first plane 101 onto the detection plane 211. The objective lens 102 is thus a lens which is part of both the first and the second particle optical unit, while the field lens 307 belongs only to the first particle optical unit and the projection lens 205 belongs only to the second particle optical unit.

A beam switch 400 is disposed in the beam path of the first particle optical unit between the multi-aperture arrangement 305 and the objective lens system 100. The beam switch 400 is also part of the second optical unit in the beam path between the objective lens system 100 and the detector system 200.

Further information relating to such multiple particle beam systems and components used therein, such as, for instance, particle sources, multi-aperture plate and lenses, can be obtained from the international patent applications WO 2005/024881, WO 2007/028595, WO 2007/028596, WO 2011/124352 and WO 2007/060017 and the German patent applications having the application numbers DE 10 2013 026 113.4 and DE 10 2013 014 976.2, the disclosure of which in the full scope thereof is incorporated by reference in the present application.

The multiple particle beam system furthermore has a computer system 10 configured both for controlling the individual particle-optical components of the multiple particle beam system and for evaluating and analyzing the signals obtained by the multi-detector 209. In this case, the computer system 10 can be constructed from a plurality of individual computers or components.

Figure 2B:
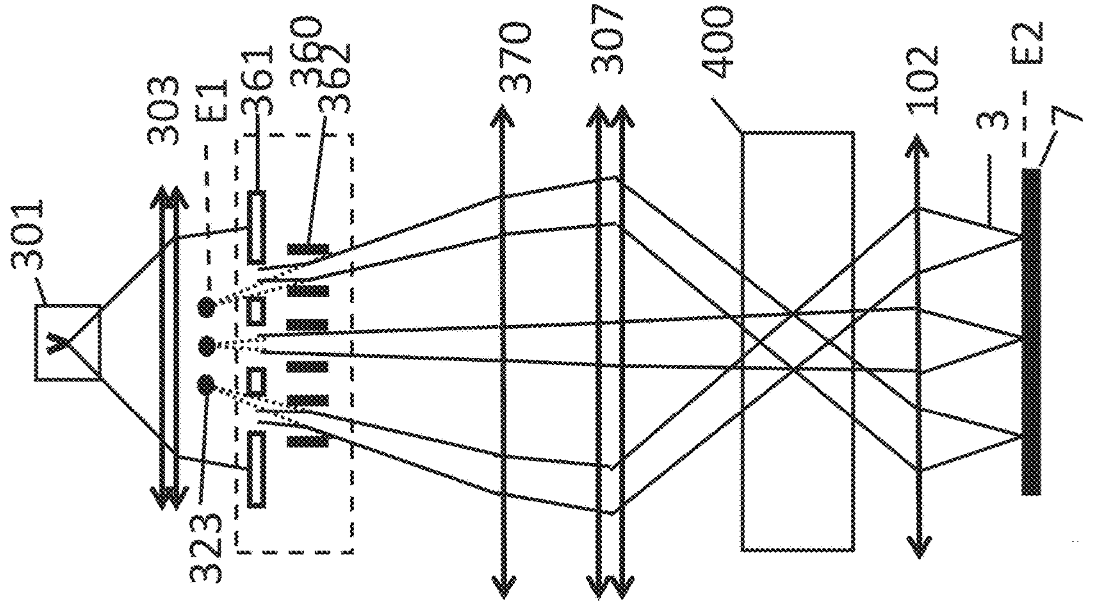
FIGS. 2A-2B: show two multiple particle beam systems with different multi-beam generators in a schematic illustration.
Figure 2A:
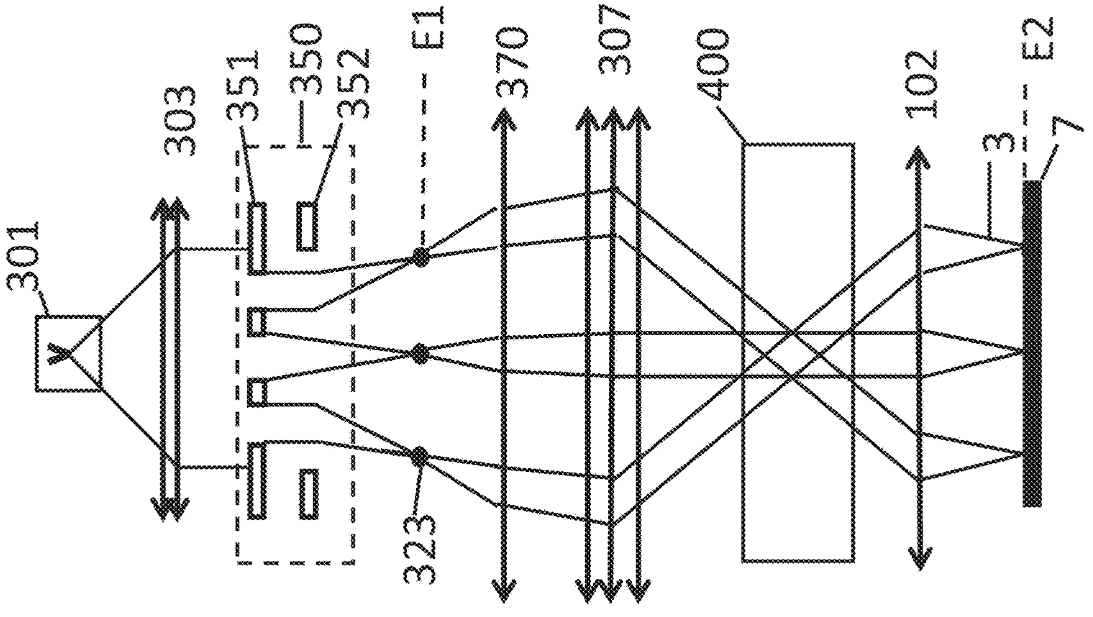

FIGS. 2A-2B show two multiple particle beam systems with different multi-beam generators in a schematic illustration. Here, FIG. 2A shows a system with a multi-beam generator 350, which has a multi-lens array consisting of a multi-aperture plate 351 and a counter electrode 352. By contrast, the system as per FIG. 2B includes a multi-beam generator 360, which has a multi-aperture plate 361 and a multi-deflector array 362.

Initially, the beam path of the particles is similar in both cases: particles, e.g., electrons, emerge from the particle beam source 301, the so-called tip. Here, proceeding from the particle source 301 in FIGS. 2A-2B (and in subsequent FIGS. 3 to 6), the optical axis of the system extends in perpendicular fashion from top to bottom. The particles emerging from the particle beam source 301 pass through a condenser lens system 303 and then arrive as a substantially parallelized particle beam bundle at the multi-beam generator 350 (FIG. 2A) or as a slightly divergent or convergent particle beam bundle at the multi-beam generator 360 (FIG. 2B shows the divergent case). Thus, the individual particle beams are generated in the multi-beam generator 350, 360. The generation mechanism is different, depending on the multi-beam generator type 350, 360 employed.

In the multi-beam generator 350, which includes the multi-lens array consisting of a multi-aperture plate 351 and a counter electrode 352, the individual particle beams 3 formed when passing through the multi-aperture plate 351 are focused and pulled apart slightly. To this end, a voltage difference is applied between the multi-aperture plate 351 and a counter electrode 352. In the process, the individual particle beams are focused on the foci 323 in a plane E1 that is disposed downstream (on the side facing away from the particle beam source 301) of the multi-aperture plate 350 as seen in the beam propagation direction and a real intermediate image of the foci 323 arises in the plane E1. Here, the foci 323 form multiple images of the real particle beam source 301. Below, these images can be considered to be virtual particle beam sources 323. It is the functionality of pulling apart the individual particle beams 3 that allows the multi-beam generator 350 to change the beam pitch of the individual particle beams in the plane E1 or, expressed differently, the pitch between the foci 323.

Below, the first plane E1 with the foci 323 is imaged in particle-optical fashion into the second plane E2, which is formed here by the surface of the sample 7. In addition to a field lens system 307, which has three mutually independently adjustable lenses, the beam switch 400 and the objective lens 102, an additional field lens 370 is located in the beam path between the planes E1 and E2.

The system illustrated in FIG. 2B has a multi-deflector array in the multi-beam generator 360 for generating a multiplicity of divergent individual particle beams 3. If the individual particle beams 3 are tracked back in the direction of the particle beam source 301, these appear to have their origin in the foci 323 in an image plane E1, which is situated on the side of the particle beam source 301 as seen from the multi-aperture plate 360. Therefore, this case is referred to as having virtual foci 323 and a virtual intermediate image plane E1. Like in the exemplary embodiment of FIG. 2A, the foci 323 can be considered to be virtual particle sources and images of the real particle beam source 301. In the embodiment variant as per FIG. 2B, too, the virtual particle sources 323 are imaged onto the plane E2, in which the surface of the object 7 should be positioned, by particle-optical imaging. Here, too, an additional field lens 370 is provided in the beam path of the individual particle beams 3 in addition to a field lens system 307. In the embodiment in FIG. 2B, setting the deflection strength of the individual deflectors in the multi-deflector array allows the beam pitch of the individual particle beams to be altered in the plane E1 or, expressed differently, allows the pitch between the foci 323 to be altered.

The multi-beam generator can also have a combination of a multi-lens array and a multi-deflector array (not illustrated). It is also possible for real foci 323 to be formed with the aid of a multi-deflector array, for example by virtue of the primary individual particle beam impinging the multi-beam generator 360 in convergent fashion. However, it is important that the multi-beam generator 350, 360 allows the pitches of the foci 323 of the individual particle beams 3 to be changed.

The numerical aperture in the object plane E2 is adjustable in the two cases shown in FIGS. 2A and 2B. Here, the pitch between the foci 323 in the intermediate image plane E1 is set with the aid of the multi-beam generator 350, 360. In the embodiment shown in FIG. 2A, the pitches of the foci 323 are set by a suitable change in the lens effect of the electrostatic lens, which is formed by the multi-aperture plate 351 and the counter electrode 352, by way of changing the potential difference between the multi-aperture plate 351 and the counter electrode 352. In the embodiment illustrated in FIG. 2B, setting the pitches between the foci 323 is implemented by a suitable change of the deflections by the multi-deflector array 362. At the same time, at least one particle-optical component in the system is set in such a way that there is no change in the beam pitch in the object plane E2, i.e., in Pitch2.

In the shown example, the additional field lens 370 serves to set or keep the focus in the object plane E2. Generally, changing the pitches of the foci 323 is also accompanied by a displacement in the real or virtual intermediate image plane E1. However, this displacement of the real or virtual intermediate image plane E1 along the optical axis is small in comparison with the obtained change in the pitches of the foci 323. The degree of freedom involved to ensure the imaging of the intermediate image plane E1 into the object plane E2 while simultaneously maintaining the orientation of the foci in the object plane (rotation), the pitch of the foci in the object plane (Pitch2) and the telecentricity conditions of the individual particle beams 3, 3*a* incident in the object plane E2 is obtained by the additional field lens 370. Here, the position of the additional field lens 370 in the beam path is not fixedly prescribed.

In the present disclosure, the product of numerical aperture and pitch can be changed in the intermediate image plane E1 by changing the lens effect of the lens consisting of the multi-aperture plate 351 and the counter electrode 352. This is possible because the otherwise conventional paraxial approximations are not applicable to the effect of this system made of multi-aperture plate 351 and counter electrode 352.

Figure 3B:
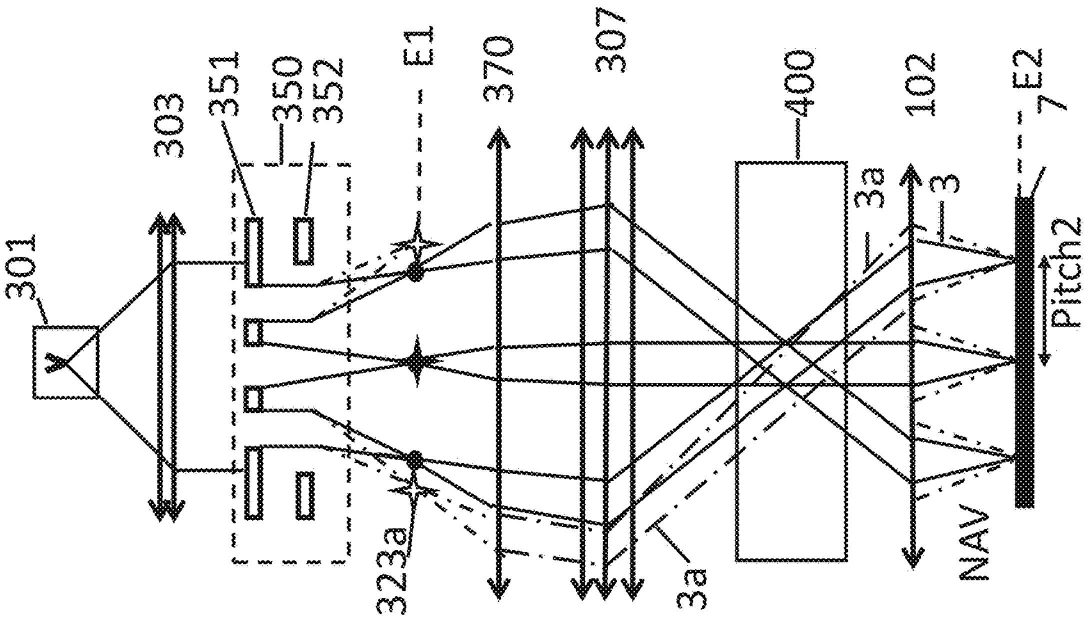
FIGS. 3A-B: illustrate the beam path of the particle beams of the system from FIG. 2A at the beginning and at the end of a setting procedure for the numerical aperture.
Figure 3A:
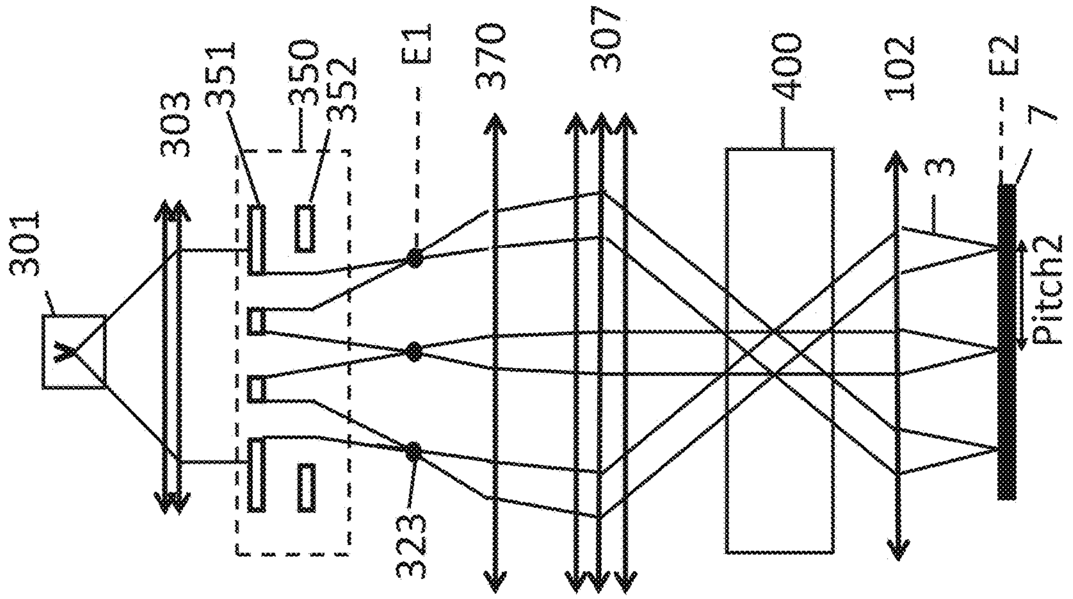

FIGS. 3A-3B illustrate the beam path of the particle beams in the case of two differently set numerical apertures of the system from FIG. 2A. In the example shown, these two different numerical apertures are present at the start of a setting procedure and at the end of a setting procedure for the numerical aperture. Alternatively, optimally set numerical apertures could be found at two different working points of the system using the examples shown in FIGS. 3A and 3B.

The multi-beam generator 350 has a multi-lens array consisting of a multi-aperture plate 351 and a counter electrode 352. FIG. 3A illustrates the beam path of the individual particle beams 3 at the start of the setting procedure; the example shown in FIG. 3B shows the illustrated system at the end of the setting procedure. The beam path at the end of the setting procedure is illustrated for the individual particle beams 3*a*, which are drawn using dash-dotted lines. At the end of the setting procedure, the numerical aperture should be set in such a way that a best-possible resolution is obtained within the scope of the particle-optical imaging. Here, the focal diameter of the individual particle beams 3*a* on the object is minimized for an optimal setting. A person skilled in the art is aware of various procedures for determining the resolution. By way of example, work can be carried out with the aid of a test sample which has a defined sharp edge. In a particle-optical image, this edge no longer appears quite as sharp but is smeared on account of the finite focal diameter of the individual particle beams, from which it is possible to draw conclusions about the focal diameter of the individual particle beams. The resolution achievable by the multiple particle beam system can be defined by the focal diameter of the individual particle beams.

In FIG. 3B, it is possible to identify the following: The images 323*a* of the particle beam source 301 generated in the plane E1 are now situated further apart than in FIG. 3A. Here, the virtual particle sources 323*a* are identified by stars and their displaced position with respect to the beam foci 323 at the start of the setting procedure of the system is illustrated. The system made of the additional field lens 370 with the three-lens field lens system 307 (thus, the system has four lenses overall in this case) is set such that the individual particle beams 3*a* are incident in the plane E2 or object plane while maintaining the telecentricity conditions (FIG. 3B illustrates telecentric incidence of the individual particle beams 3*a*), albeit with a greater numerical aperture (identifiable from the expanded beam cone of the individual particle beams 3*a* between the objective lens 102 and the plane E2). This expansion of the beam cone corresponds to the change in the numerical aperture, which is indicated in the figure by the double-headed arrow and the NAV label. Nevertheless, the beam pitch between the individual particle beams 3, 3*a* in the plane E2 remains unchanged (Pitch2 remains constant). Furthermore, the orientation of the individual particle beams 3, 3*a* around the optical axis in the plane E2 and the focusing of the individual particle beams 3, 3*a* in the plane E2 can optionally be maintained unchanged.

Moreover, all other particle-optical parameters p, not explicitly mentioned, which characterize the particle-optical imaging, in particular characterize this completely, can also be kept constant. Thus, in that case, all that is changed is the beam pitch between adjacent individual particle beams in the first plane E1 and the numerical aperture of the multi-beam particle optical unit in relation to the second plane E2 and, optionally, variables dependent thereon.

Except for the effect settings on the particle-optical components, no further changes were undertaken in the system in FIGS. 3A-3B. Thus, the change in the numerical aperture can be brought about purely by setting the effects or excitations. In particular, no structural modifications are involved; in particular, no multi-beam generator or any of its components need(s) to be structurally modified, moved or even replaced.

Figure 4A:
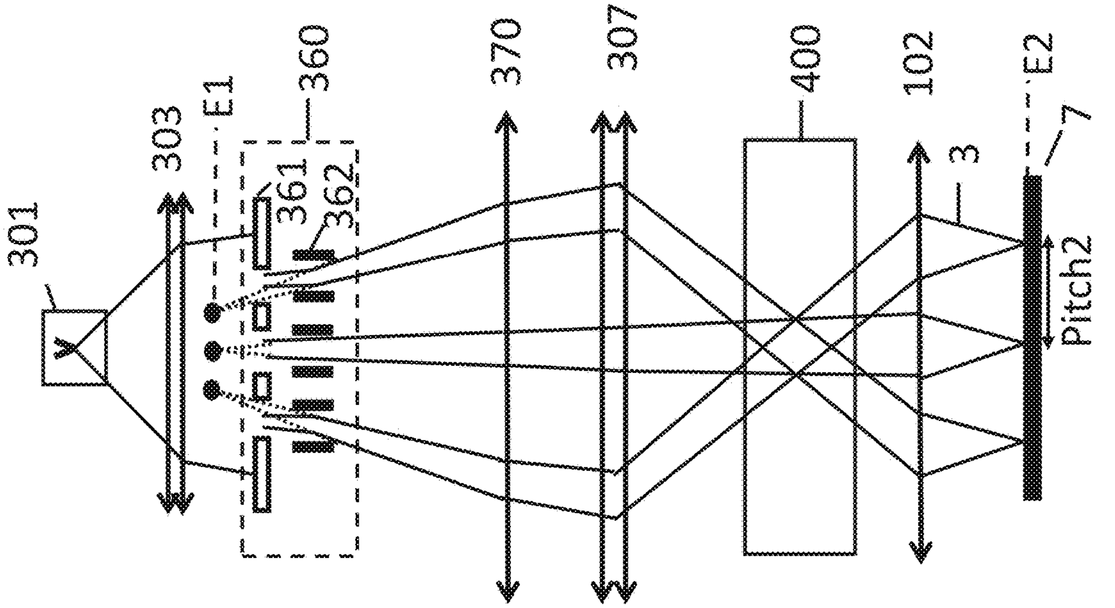
FIGS. 4A-4B: illustrate the beam path of the particle beams at two different working points of the system from FIG. 2B.
Figure 4B:
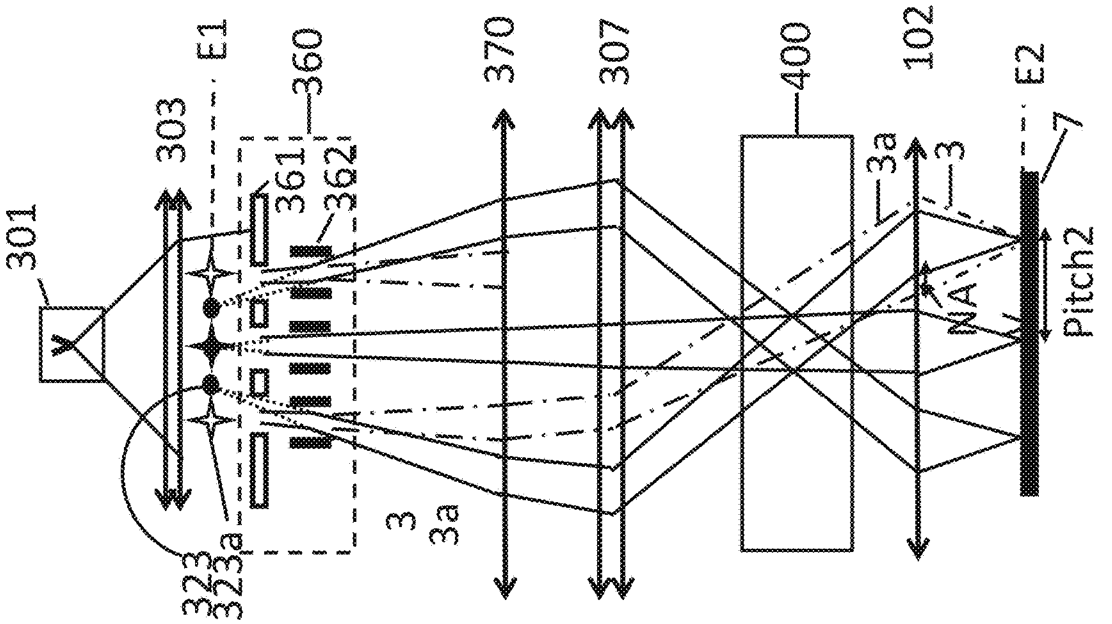

FIG. 4A-4B illustrate the beam path of the particle beams at two different working points of the system from FIG. 2B, each with a finally set numerical aperture. Here, a multi-deflector array 362 in combination with a multi-aperture plate 361 is used as a multi-beam generator 360. The beam path at the first working point is illustrated using a solid line (individual particle beams 3); the beam path at the second working point is illustrated once again using a dash-dotted line (individual particle beams 3*a*).

In this embodiment variant of the disclosure, too, the pitch of the individual particle beams in the virtual intermediate image plane E1 is varied by a change in the deflections obtained by the multi-deflector array 362 (Pitch1 is varied). The foci 323*a* at the second working point are indicated by stars. The foci 323*a* are imaged in particle-optical fashion onto the surface of the sample 7 or into the plane E2. The system made of the additional field lens 370 with the two-lens field lens system 307 (thus, the system has three lenses overall in this case) is set such that the individual particle beams 3*a* are incident on the plane E2 or object surface while maintaining the telecentricity conditions (FIG. 4B once again illustrates telecentric incidence of the individual particle beams 3*a*), albeit with a greater numerical aperture. Here, the beam pitch between the individual particle beams 3, 3*a* remains unchanged (Pitch2 is constant). Here, too, the particle beam cone impinging the sample 7 is expanded in comparison with the first working point. Here, too, the numerical aperture is thus altered, as indicated by the double-headed arrow or the label NAV in the drawing. Furthermore, the orientation of the individual particle beams 3, 3*a* around the optical axis in the plane E2 and the focusing of the individual particle beams 3, 3*a* in the plane E2 can optionally once again be maintained unchanged.

The working point setting is altered in the system of FIGS. 4A-4B. Here, for example, a working point can be defined by the beam current intensity, the landing energy, the position of the object (as a result of altering the stage position) and/or the employed individual beam source (the tip). In general, other definitions are also conceivable and apparent to a person skilled in the art. However, with the exception of settings of the working point, no further alterations are then undertaken at the particle-optical components, apart from the effect settings, for the purposes of setting the numerical aperture. Thus, the change in the numerical aperture can be brought about at a different working point, too, purely by setting the effects or excitations. No structural modifications are involved; in particular, no multi-beam generator or any of its components need(s) to be structurally modified, moved or even replaced.

FIGS. 5 and 6 show, once again, the multiple particle beam systems of FIGS. 3 and 4, respectively, to be precise in combination with a particle multi-detector 209 in each case. The secondary electrons emerging from the sample 7 are deflected in spatially resolved fashion in the direction of the particle multi-detector 209 by way of the beam switch 400. In the process, the secondary particle beams 9 are incident on the particle multi-detector 209 after having passed through the projection lens system 205 and after having passed through an aperture stop 210. It should be noted that this is a very schematic illustration. With respect to details, reference is made to the documents cited at the outset.

Figure 5:
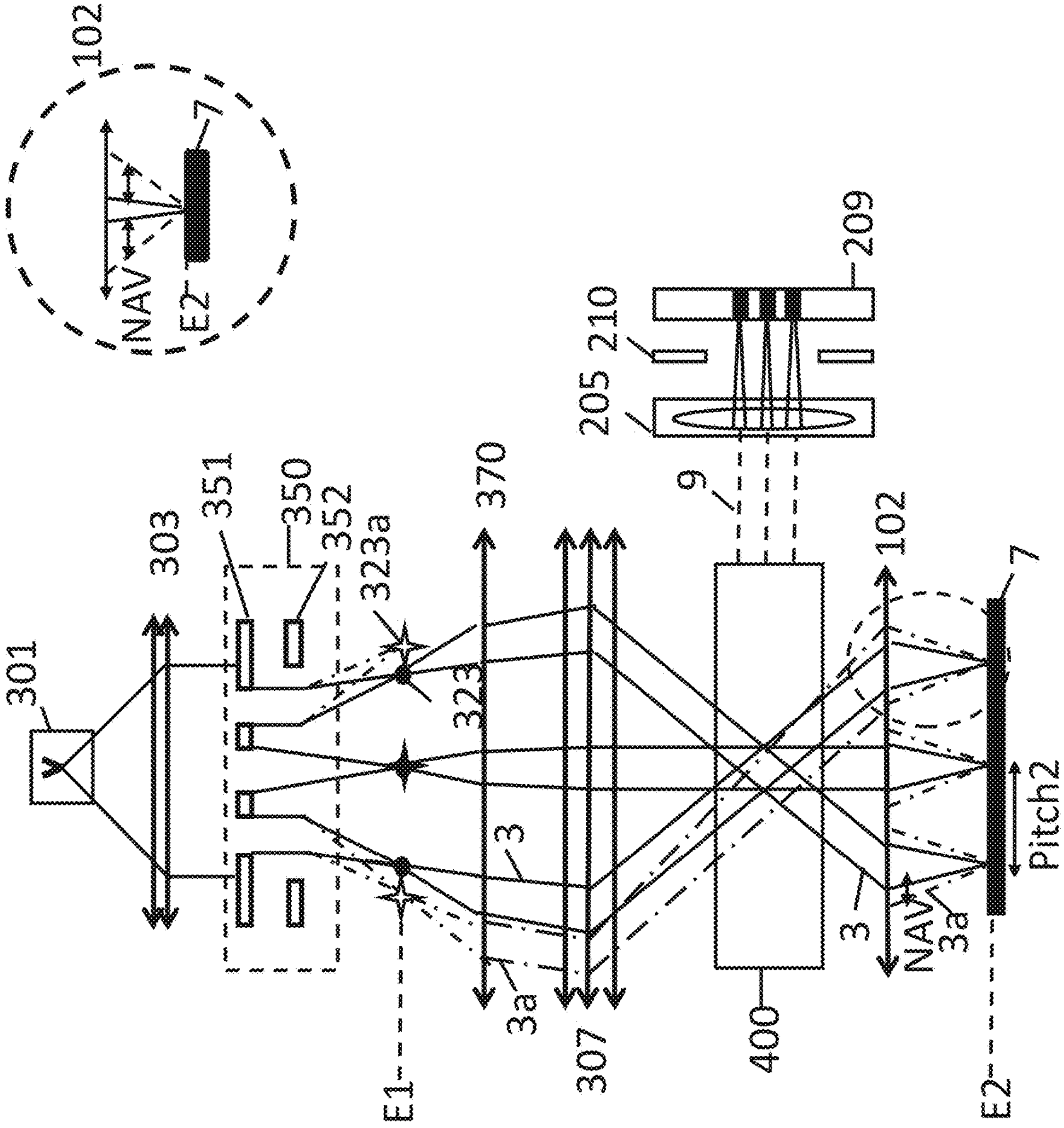
FIG. 5: shows the system from FIG. 2A with subsequent imaging of secondary electrons onto a particle multi-detector.
Figure 6:
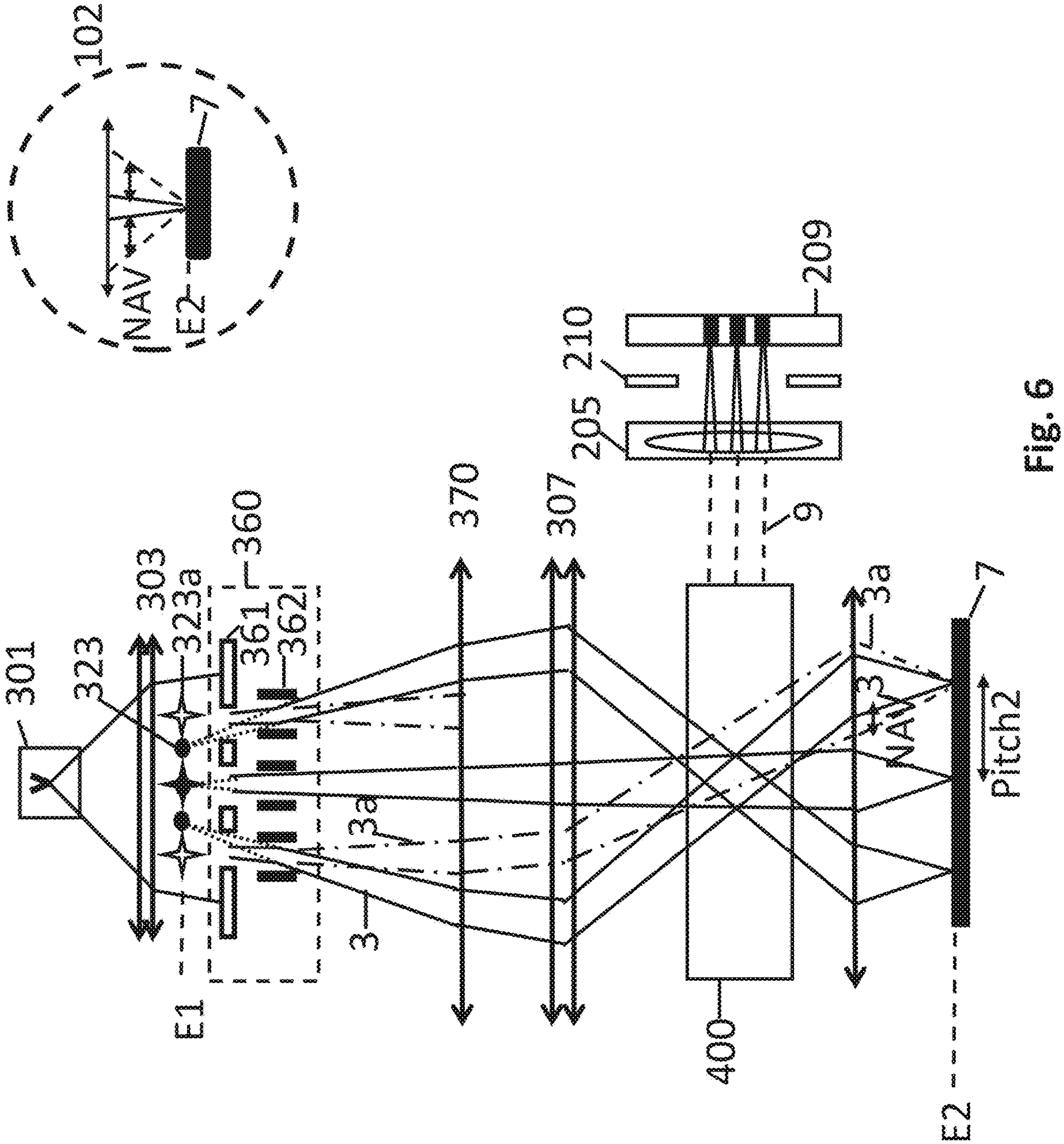
FIG. 6: shows the system from FIG. 2B with subsequent imaging of secondary electrons onto a particle multi-detector.

In the dashed circle in both FIG. 5 and FIG. 6, an excerpt from the beam path in the multiple particle beam system is additionally shown in a magnified illustration, which once again elucidates the variation in the numerical aperture by the expansion of the particle beam cone. Thus, the numerical aperture is altered; this is indicated by the double-headed arrow labeled NAV. However, the points of incidence of the beams 3 and 3*a* on the sample 7 remain unchanged in the process. Pitch2 is not varied.

Further embodiments of the disclosure are described below and, in particular, explanations are provided as to how the Helmholtz-Lagrange invariant HLI can be altered according to the disclosure.

It is the object to alter the numerical aperture (NA) of the individual beams without changing the beam pitch of the individual particle beams in the object plane as a result thereof. The selective increase of the numerical aperture has the desirable effect of achieving a smaller spot size of the illumination spots of the individual beams on the sample in the process, and hence of improving the resolution during the imaging if the aberrations in the imaging optical unit do not become too large. Therefore, altering the numerical aperture, in particular increasing the latter, is advantageous, in particular, for particle beam systems with an improved correction, for example with reduced beam dispersion or reduced spherical aberration.

Unlike in individual beam systems, the numerical aperture or the pitch of the individual beams cannot simply be altered in multi-beam systems with a multiplicity of individual beams in a grid arrangement. The beam pitch or pitch of the grid arrangement of the multiplicity of individual beams is fixedly specified by way of a multi-aperture plate. The multi-aperture plate generates a multiplicity of beam focus points in an intermediate image plane, for example N focus points in one direction with pitch P1 and a numerical aperture of an individual beam NA1. If the imaging system disposed downstream of the multi-aperture plate has an imaging scale M1, the numerical aperture in the image plane is $NA2=NA1/M1\times\sqrt{U1/U2}$ and the pitch P2 on the sample is $P2=M1*P1$. Thus, pitch and NA are coupled to one another and cannot be altered independently of one another. Therefore, the problem of NA change occurs in the case of multi-beam microscopes, which image a multiplicity of individual beams through a common optical unit. An NA change generally leads to a change in the beam pitch, which is undesirable. Therefore, conventional multi-beam microscopes do not allow changing the numerical aperture without changing the pitch at the same time.

It is advantageous to distribute as many beams as possible over a specified area. However, the detection path must separate the associated secondary beams, in particular while taking account of the energy spectra of the secondary electrons (SE). This yields a minimum pitch. This minimum pitch depends on the performance (aberrations) of the imaging optical unit, the sample (energy spectrum of the SE) and the contrasts to be imaged (filtering of the energy spectra of the SE). There are critical samples involving a greater pitch and good-tempered samples where work can be carried out with a smaller pitch. Flexibility that is adaptable to the sample is also advantageous here and the exemplary embodiments of the disclosure render it possible to set the pitch of the grid arrangement and the numerical aperture of the individual beams independently of one another. A special case where the pitch is kept constant is considered below. In an equivalent embodiment, the numerical aperture is kept constant and the pitch is altered. In a further equivalent embodiment, the numerical aperture and pitch are altered independently of one another; for example, both are increased or reduced.

A description with U1=U2 follows, which is why the factor $\sqrt{U1/U2}$ is dispensed with in the following. An extension with U1 not equal to U2 is within the grasp of a person skilled in the art without involving an inventive step.

Beyond the multi-aperture plate there is an imaging system, which images the multiplicity of beam focus points into an image plane in which the object is disposed. The imaging system consists of successively disposed electron-optical imaging components and forms a conservative system with the Helmholtz-Lagrange invariant $HLI=NA1\times N\times P1\times\sqrt{U1}$ as conserved quantity. A characteristic of a so-called conservative imaging system is that the HLI remains unchanged; i.e., a change in the numerical aperture on the sample as a result of changing the imaging scale always also changes the pitch of the multiplicity of individual beams in the case of an unchanged voltage.

Changing the NA without changing the pitch and without changing the voltage ratios U1/U2 therefore involves changing HLI1 into HLI2.

One solution for changing the HLI1 lies in providing a multi-aperture plate with a different pitch, for example by way of an exchange. It is an object of the disclosure to provide an NA change, for example, without changing the pitch and without exchanging the multi-aperture plate.

According to the disclosure, the object is achieved by an inventive combination of a novel multi-aperture plate or a novel multi-aperture plate arrangement (a novel multi-beam generator) with a downstream electron beam optical unit which has been configured according to the disclosure.

According to an embodiment, a multi-aperture plate with an array of deflectors enables an alteration of the beam pitch without a change in NA. The deflectors set a pitch P3 without changing NA1. This yields $HLI3=P3\times N\times NA1$. As a result of the downstream electron beam optical unit which is configured according to the disclosure, a change in the imaging scale from M1 to $M2=P2/P3$ sets the pitch P2, desired constant, on the sample and, in the process, an altered $NA3=NA1/M2$ is set at the same time, where $NA3=HLI3/(N\times P3)$.

According to an embodiment, the multi-aperture plate enables an NA change without a pitch change by way of beam shaping with a variable NA.

In one configuration, the multi-aperture plate enables an NA change without a pitch change by way of an electron-optical lens, which is disposed downstream of the multi-aperture plate. The lens disposed downstream of the multi-aperture plate simultaneously brings about a change, for example an increase, in the numerical aperture to NA6 and an aligned change, for example an increase, in the pitch to P6 such that $HLI6=P6\times N\times NA6$ arises, wherein HLI6 is not equal to HLI1. The subsequent electron-optical imaging system is used to set an imaging scale M6 such that a pitch of $P2=P6\times M6$ arises in the image plane, with the correspondingly modified aperture $NA7=NA6/M6$ being obtained.

Figure 7:
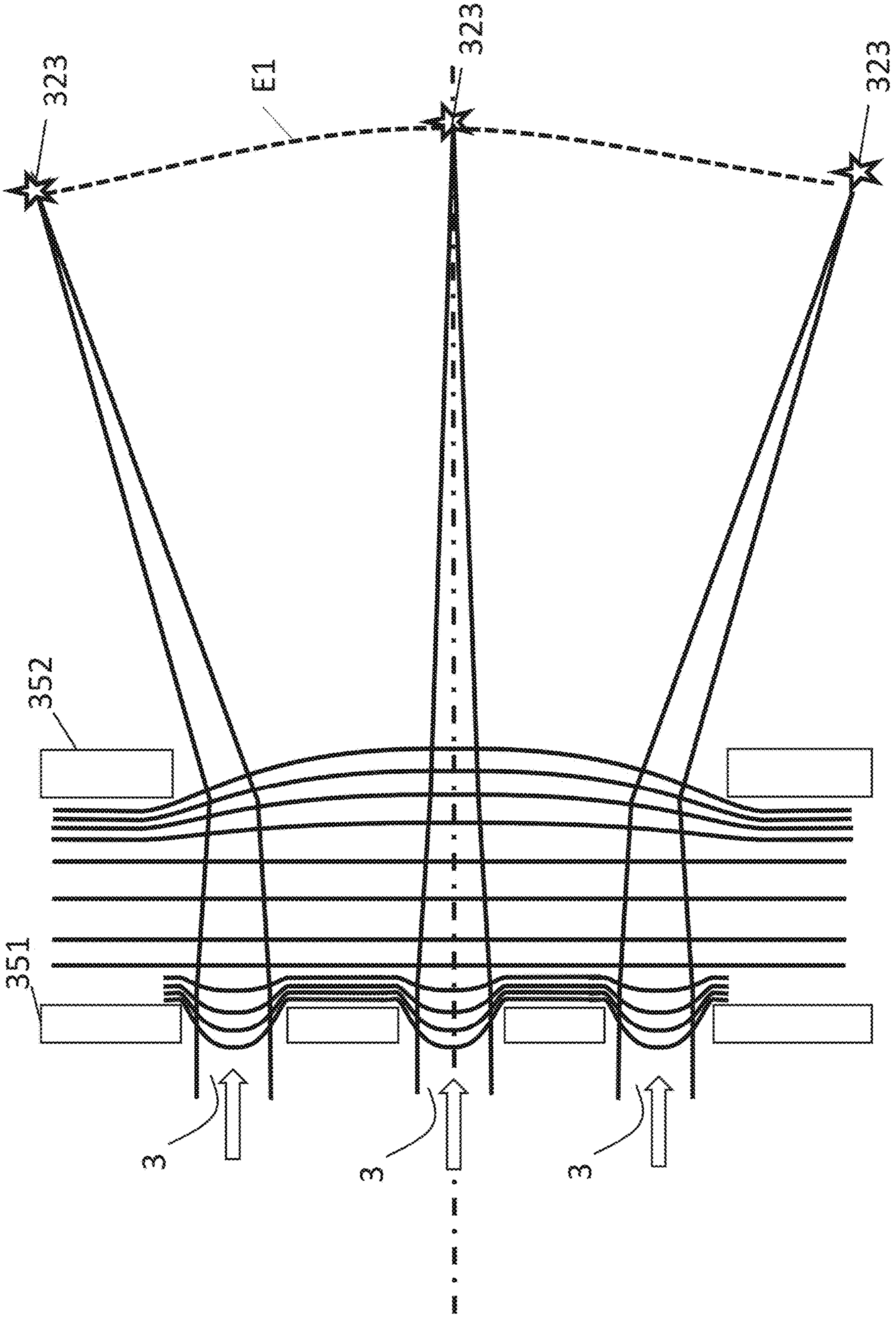
FIG. 7: schematically illustrates the beam path of individual particle beams when passing through a multi-lens array.
Figure 8:
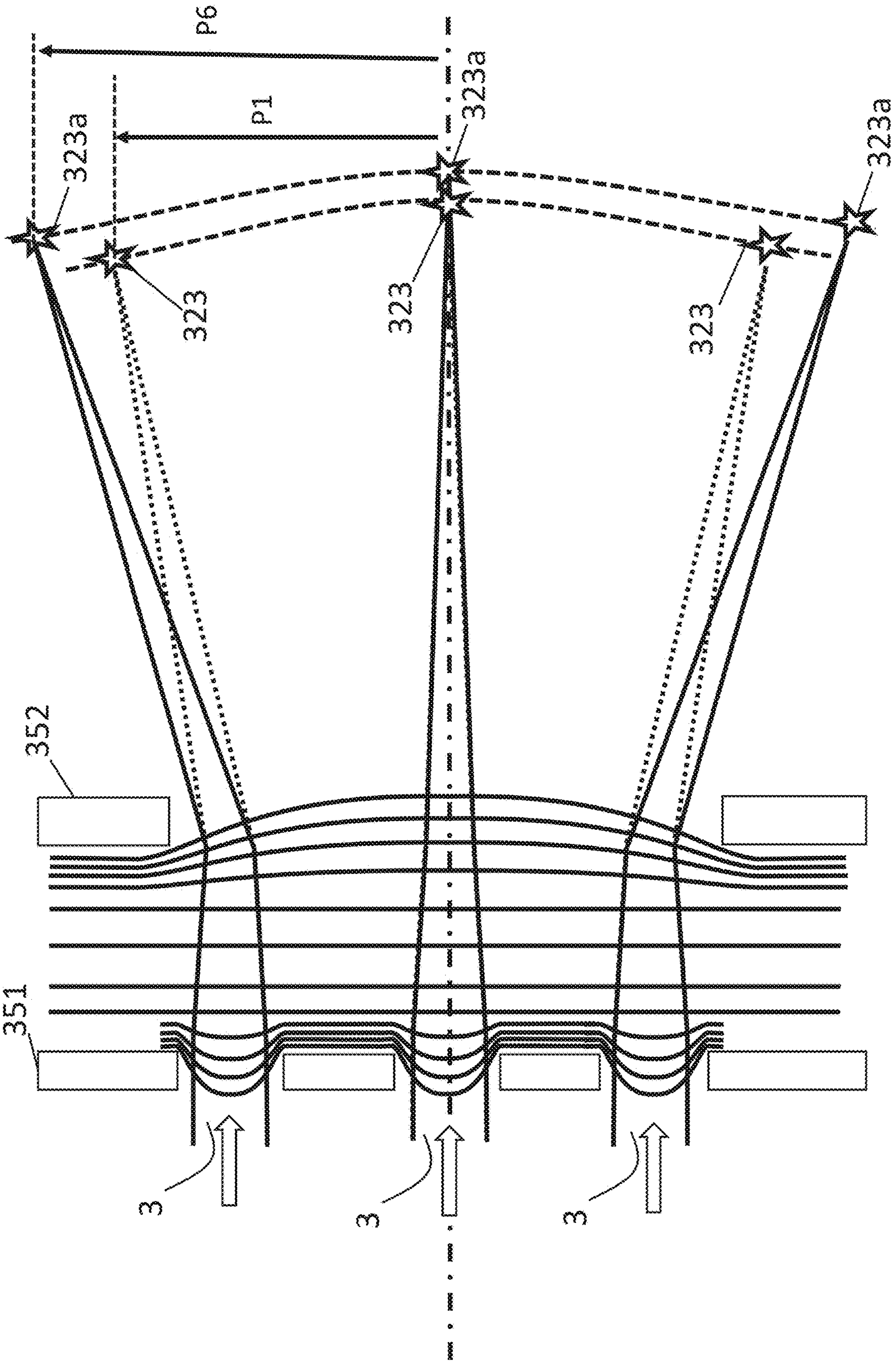
FIG. 8: schematically illustrates the change in the pitch in the intermediate image plane in the case of an altered setting of the multi-lens array from FIG. 7.

FIG. 7 schematically illustrates the beam path of individual particle beams 3 when passing through a multi-lens array with a multi-aperture plate 351 and with an electronic lens 352 as a counter electrode and FIG. 8 schematically illustrates the change in the pitch in the intermediate image plane E1 in the case of an altered setting of the multi-lens array of FIG. 7. According to this exemplary embodiment, the pitch is changed, increased in this case, from P1 to P6 by way of an altered actuation of the combined lens. The pitch and the numerical aperture change in the same direction; if the pitch increases, so does the numerical aperture. According to the example shown, the multi-aperture plate 351 can be at ground potential, for example, and a high voltage of a few kV, for example a voltage between 10 kV and 20 kV, for instance approximately 13 kV, 14 kV, 15 kV, 16 kV or 17 kV can be applied to the electronic lens 352. If this high voltage is increased, there is increase both in the refractive power of the micro-lenses 351 and in the refractive power of the macro-lens 352; consequently, the focal length of the micro-lenses 351 shortens (NA increase) and the pitch P1 increases to the pitch P6 by way of the macro-lens 352. The negative macro-lens 352 slightly increases the focal length again and there is a slight shift in the intermediate image plane E1; however, the change in pitch from P1 to P6 is dominant. As a result, the Helmholtz-Lagrange invariant increases.

Figure 9:
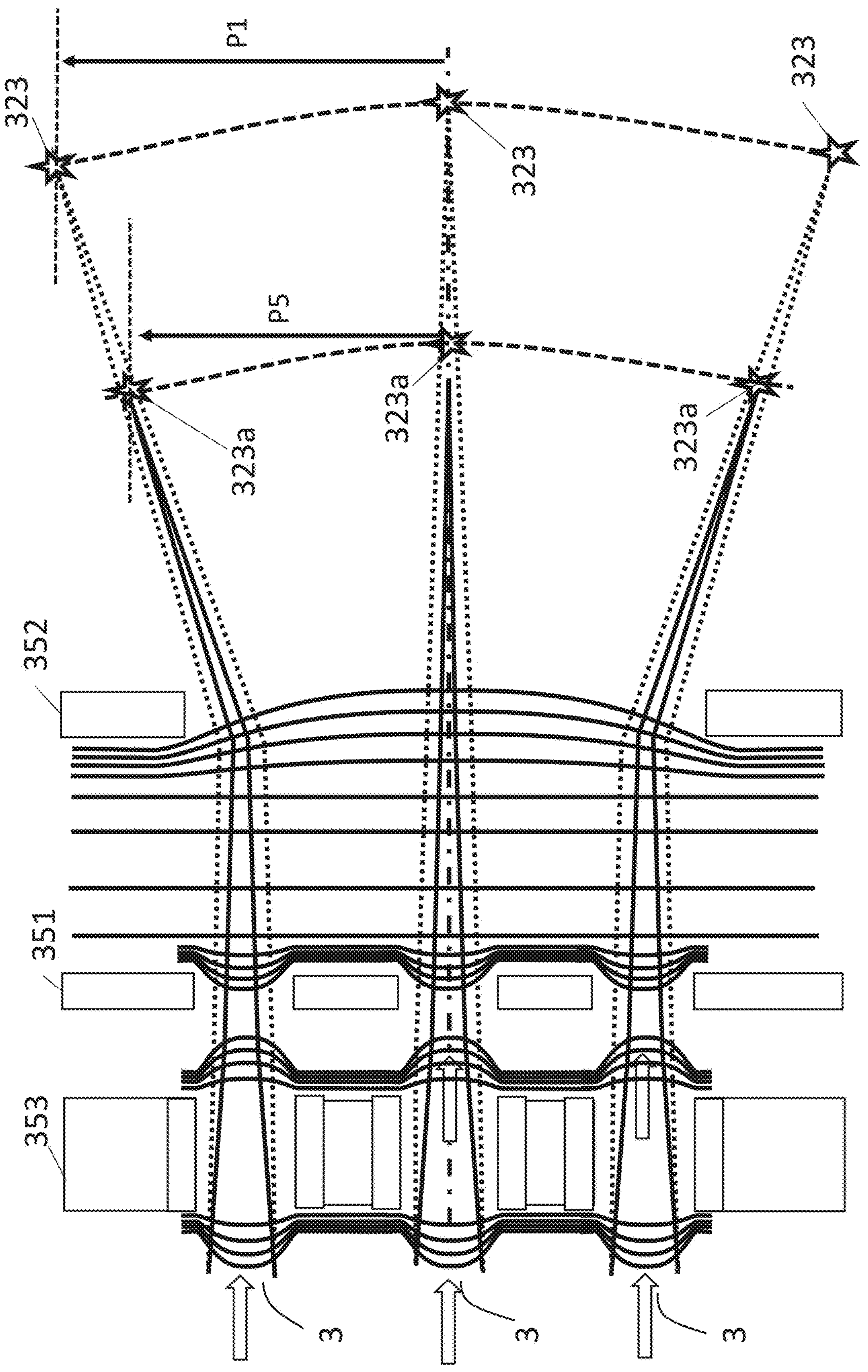
FIG. 9: schematically illustrates the beam path of individual particle beams when passing through a multi-lens array with an additional micro-lens array.

In one configuration, the multi-aperture plate 351 enables an NA change without a change in pitch by way of an additional independent focal length change via a multiplicity of micro-lenses 353 in the micro-optical unit. FIG. 9 schematically illustrates the beam path of individual particle beams 3 when passing through a multi-lens array with an additional micro-lens array 353. To this end, a micro-lens array 353 is provided in the micro-optical unit in addition to the multi-aperture plate 351 and in addition to the electron-optical lens 352. NA5 is obtained following a change in focal length. By way of example, using the macro-lens 352 with a voltage HV5, the pitch in the intermediate image plane E1 is set to P5 and $HLI5=P5\times N\times NA5$ is obtained; the change in focal length is accompanied at the same time by a change in the focal position. By way of example, the additional micro-lenses of the micro-lens array 353 shorten the focal length of the individual particle beams 3 in the case of the same design of the combined lens of multi-aperture plate 351 and counter electrode 352; hence, this leads to an independent pitch and NA change. The pitch $P2=M1\times P1$, desired constant, is set by way of suitable afocal refocusing via variable electron-optical lenses of a downstream electron beam optical unit which is configured according to the disclosure, with the correspondingly modified aperture $NA4=NA5/M1$ being obtained.

In the embodiment variant illustrated in FIG. 9, it is additionally or alternatively also possible that the variation of the pitch of the individual particle beams 3 in the first plane E1 is substantially set by setting an effect at the micro-lens array 353. Thus, voltages of, e.g., several hundred volts can be applied to the micro-lens array 353, for example approximately 100 V, 200 V or 300 V. A variation in these voltages changes the lens effects and also changes the pitch set in the intermediate image plane E1. Even though high voltages are not normally used in micro-optics, it is possible to obtain desired focal length changes and desired changes in the pitch in the intermediate image plane E1 since there are electron-optical lenses which have a comparatively high refractive power despite relatively low voltages applied. By way of example, an option for realization is represented by quadrupole lens sequences as disclosed, for example, in the German patent application with the application number 10 2020 107 738.6; the disclosure of the German patent application 10 2020 107 738.6 is incorporated, in the entirety thereof, in this patent application by reference. Other realizations are also possible.

Equivalently, the presented approach can also bring about a change in the pitch P while the numerical aperture remains unchanged. Characteristic of the disclosure is a second change from a first numerical aperture NA1 into a second numerical aperture NA2 with a simultaneous first change of a first pitch P1 into a second pitch P2, wherein the first ratio of the first change of the pitch P2/P1 from the inverted, second ratio of the second change in the numerical apertures NA1/NA2 from the imaging scale M of the projection system disposed downstream of a multi-aperture plate changes by more than the ratio of the roots of the second voltage in the image plane and of the first voltages in a field plane disposed downstream of the multi-aperture plate:

By contrast, in the case of a simple change of the imaging scale M, the second change is implemented precisely with the ratio of the roots of the second voltage in the image plane and of the first voltages in a field plane disposed downstream of the multi-aperture plate, since the following applies to the projection system with an imaging scale M:

$$P2=M\times P1 \text{ and}$$

$$NA2\times\sqrt{U2}=NA1\times\sqrt{U1}/M$$

and consequently the following applies to the first ratio $P2/P1=M$ and the following applies to the second ratio $NA1/NA2=M\times\sqrt{U2/U1}$.

Figure 10:
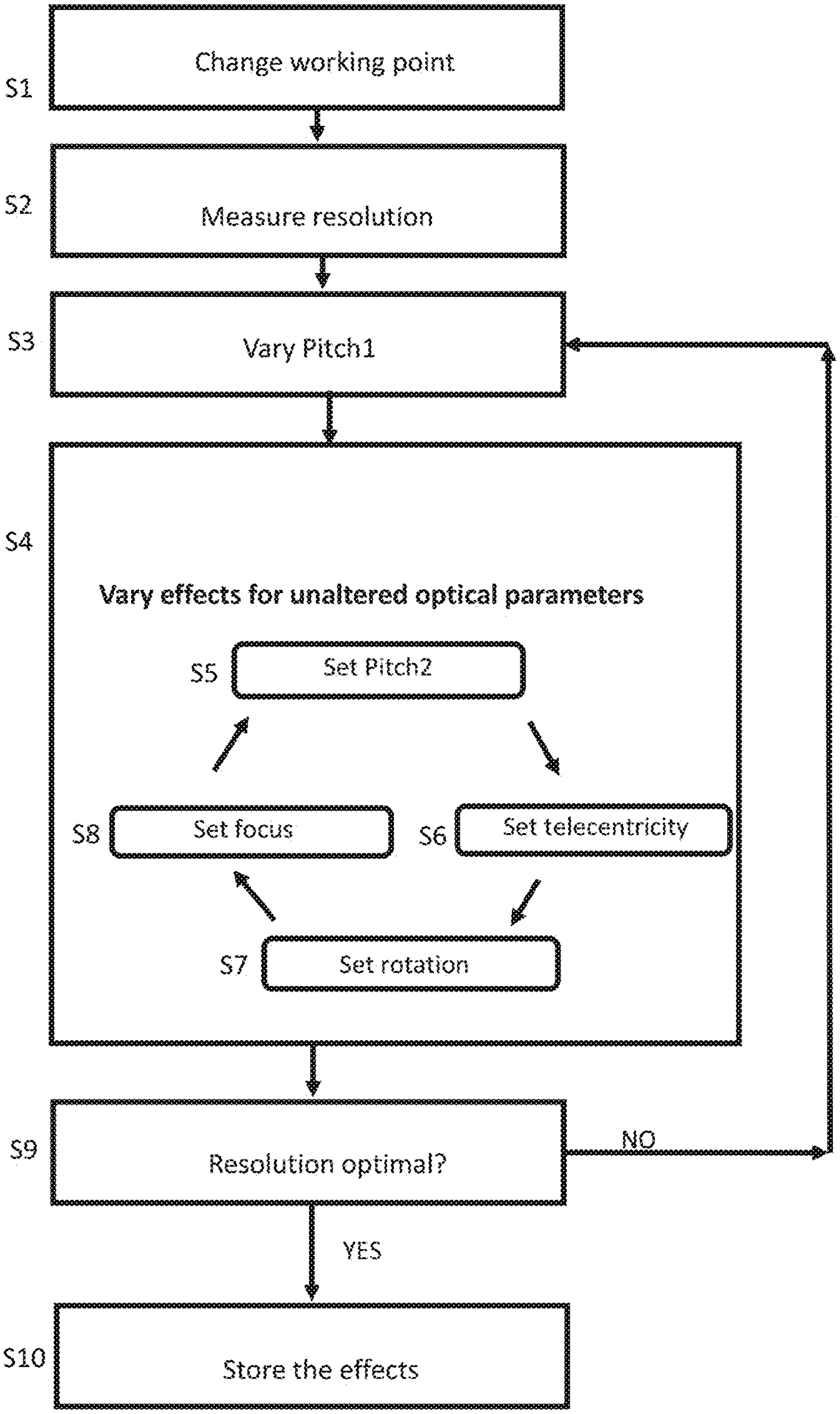
FIG. 10: shows a flowchart for optimizing the resolution.

FIG. 10 shows a flowchart for optimizing the resolution during particle-optical imaging using the method according to the disclosure. In the process, the numerical aperture is also changed automatically. The assumption is initially made that the overall system has already been set for a first working point. Thus, in this case, all effects of the particle-optical components are already known for the first working point which, for example, may be characterized by the beam current intensity and/or the landing energy of the particles on the sample.

In a first step S1, the working point is now changed; i.e., a second or further working point is defined and set accordingly. Then, the resolution which is obtained with the already preset effects of the particle-optical components is measured in step S2. Now, in a further step S3, the beam pitch between adjacent individual particle beams in the first plane E1, i.e., in the intermediate image, is varied (variation Pitch1). The intermediate image can be either a virtual intermediate image or a real intermediate image. Here, the beam pitch is varied by way of appropriate settings on the multi-beam generator 350, 360.

Now, the remaining particle-optical components of interest are set at the second working point in a further method step S4 such that these remaining particle-optical parameters remain constant or have the same values as when setting the overall system at the first working point. The setting (readjustment) of the remaining particle-optical components, involved to this end, for keeping constant all remaining particle-optical parameters is advantageously implemented by way of an iterative process. A plurality of steps of this iterative process are shown in exemplary fashion in the large box of FIG. 10. The object of this setting is that the beam pitch between adjacent individual particle beams in the second plane E2, i.e., on the sample, remains unchanged in comparison with the beam pitch at the first working point (Pitch2 constant). Further objects can be that the focusing of the individual particle beams in the plane E2 and/or the telecentricity conditions of the individual particle beams upon incidence of the individual particle beams into the objective lens 102 and/or the orientation of the individual particle beams about the optical axis (rotation) remain constant; the readjustment is implemented in step S5 of the flowchart. The telecentricity is set in step S6, if desired, the rotation is set in step S7, if desired, and the focus is set in step S8, if desired.

By varying the beam pitch between the individual particle beams 3, 3*a* at the intermediate image plane E1 (variation Pitch1) and by simultaneously keeping constant the other particle-optical parameters (in particular the beam pitch of the individual particle beams on the object (Pitch2), the numerical aperture at the intermediate image (no structural modification of the multi-beam generator) and the electric potentials U1 and U2), the numerical aperture NA2 is varied in the plane E2 and consequently at the object in the process, and the numerical aperture can be optimized.

Following each iteration pass as described above, a check is carried out by measurement as to whether the resolution is now optimal (step S9). If this is the case, the found effects for the second working point are stored in a lookup table. Should the resolution not be optimal yet, the beam pitch between adjacent individual particle beams in the first plane E1 is varied anew in step S3. Subsequently, different settings are then set for the particle-optical components and the resolution obtained in that case is measured. This is repeated until a setting is found in which the resolution is optimal and consequently maximal or at least meets predefined target desired properties.

It is possible to omit one or more method steps from FIG. 10 or to carry out method steps in a different sequence. In this respect, the example shown in FIG. 10 should not be construed as restrictive.

What is claimed is:

1. An electron-beam device, comprising upper-column electron optics and lower-column electron optics comprising:

an aperture array to divide an electron beam into a plurality of electron beamlets;

a lens array comprising a plurality of lenses to adjust the focus of the plurality of electron beamlets, wherein respective lenses of the plurality of lenses are to adjust the focus of respective electron beamlets of the plurality of electron beamlets; and a first macro-lens to adjust the focus of the plurality of electron beamlets in a manner opposite to the lens array;

wherein the lens array is disposed between the aperture array and the first macro-lens.

2. The electron-beam device of claim 1, further comprising a second macro-lens to collimate the plurality of beamlets and provide the plurality of beamlets to the lower-column electron optics, wherein the first macro-lens is disposed between the lens array and the second macro-lens.

3. The electron-beam device of claim 2, wherein the second macro-lens comprises a magnetic lens.

4. The electron-beam device of claim 2, wherein the lower-column electron optics comprise a field lens and an objective lens, the field lens being configured to produce a cross-over of the electron beamlets between the transfer lens and the objective lens.

5. The electron-beam device of claim 1, wherein:

the lens array comprises:

a first plate having a first plurality of bores corresponding to respective apertures in the aperture array, a second plate having a second plurality of bores corresponding to the first plurality of bores and the respective apertures in the aperture array, and a third plate having a bore to allow passage of the plurality of beamlets; and the first macro-lens comprises:

the third plate.

6. The electron-beam device of claim 5, wherein the first plate is grounded;

the second plate is configurable to be biased to provide a beam-individual focal length change to the electron beamlets; and the third plate is configurable to be positively biased.

7. The electron-beam device of claim 1, wherein the lens array is configurable to focus the electron beamlets; and the first macro lens is configurable to defocus the plurality of beamlets as focused by the lens array.

8. A method, comprising, in the upper-column electron optics of an electron-beam device:

dividing an electron beam into a plurality of electron beamlets using an aperture array;

adjusting the focus of the plurality of electron beamlets using a lens array comprising a plurality of lenses, comprising using respective lenses of the plurality of lenses to adjust the focus of respective electron beamlets of the plurality of electron beamlets; and adjusting the focus of the plurality of electron beamlets using a first macro-lens, wherein:

the first macro-lens lens adjusts the focus of the plurality of electron beamlets in a manner opposite to the lens array; and the lens array is disposed between the aperture array and the first macro-lens.

9. The method of claim 8, further comprising, in the upper-column electron optics:

collimating the plurality of beamlets; and providing the collimated plurality of beamlets to lower-column electron optics of the electron-beam device.

10. The method of claim 9, wherein:

adjusting the focus of the plurality of electron beamlets using the lens array comprises focusing the plurality of electron beamlets; and adjusting the focus of the plurality of electron beamlets using the first macro-lens comprises defocusing the plurality of electron beamlets as focused by the lens array.

* * * * *